(12) United States Patent
Kambe

(10) Patent No.: US 9,515,110 B2
(45) Date of Patent: Dec. 6, 2016

(54) SOLID-STATE IMAGING DEVICE, METHOD OF MANUFACTURING SOLID-STATE IMAGING DEVICE, AND ELECTRONIC APPARATUS

(71) Applicant: Sony Corporation, Tokyo (JP)

(72) Inventor: Terumi Kambe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/513,511

(22) Filed: Oct. 14, 2014

(65) Prior Publication Data
US 2015/0108598 A1     Apr. 23, 2015

(30) Foreign Application Priority Data
Oct. 21, 2013   (JP) ................................ 2013-218065

(51) Int. Cl.
*H01L 27/146* (2006.01)

(52) U.S. Cl.
CPC ..... *H01L 27/14623* (2013.01); *H01L 27/1464* (2013.01); *H01L 27/14603* (2013.01); *H01L 27/14612* (2013.01); *H01L 27/14621* (2013.01); *H01L 27/14627* (2013.01); *H01L 27/14641* (2013.01); *H01L 27/14645* (2013.01); *H01L 27/14685* (2013.01); *H01L 27/14687* (2013.01)

(58) Field of Classification Search
None
See application file for complete search history.

(56) References Cited

U.S. PATENT DOCUMENTS

2011/0109776 A1*   5/2011   Kawai ............... H01L 27/14625
                                                                 348/273

FOREIGN PATENT DOCUMENTS

JP   2012-064822 A   3/2012
JP   2013-026332 A   2/2013

\* cited by examiner

*Primary Examiner* — Yasser A Abdelaziez
(74) *Attorney, Agent, or Firm* — Sheridan Ross P.C.

(57) ABSTRACT

There is provided a solid-state imaging device including: a semiconductor substrate that is formed with a photodiode for each pixel; a light shielding film that is laminated on the semiconductor substrate on a side of a light irradiated surface which is irradiated with light, and is formed to include an opening corresponding to a spot in which at least the photodiode is arranged; and a photoelectric conversion film that is laminated to cover the light irradiated surface of the semiconductor substrate and the light shielding film, and is configured to generate an electrical charge by absorbing light. The photoelectric conversion film is formed of a material which has higher light absorptivity than light absorptivity of the semiconductor substrate.

17 Claims, 15 Drawing Sheets

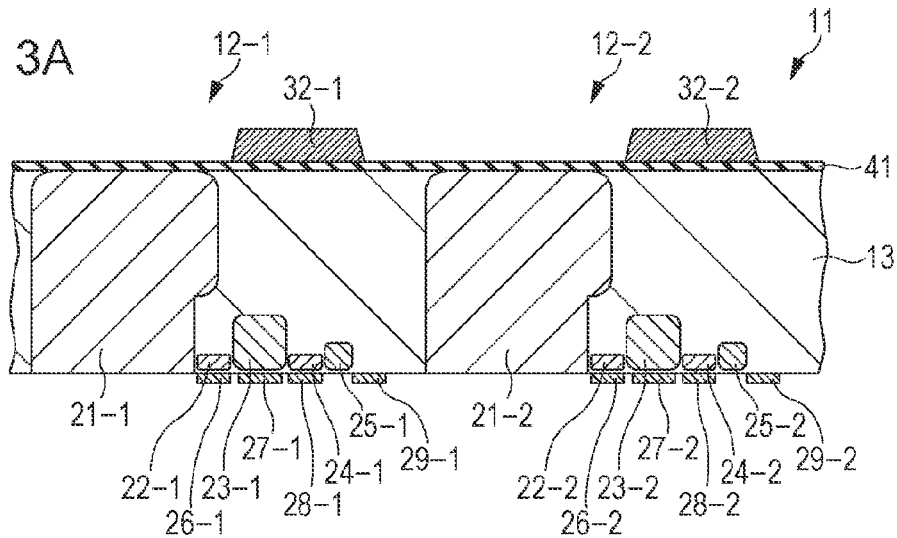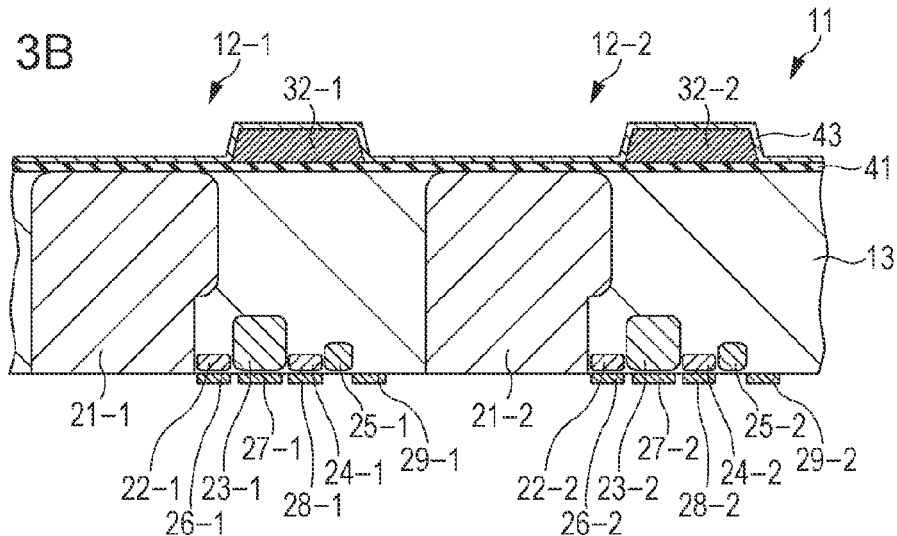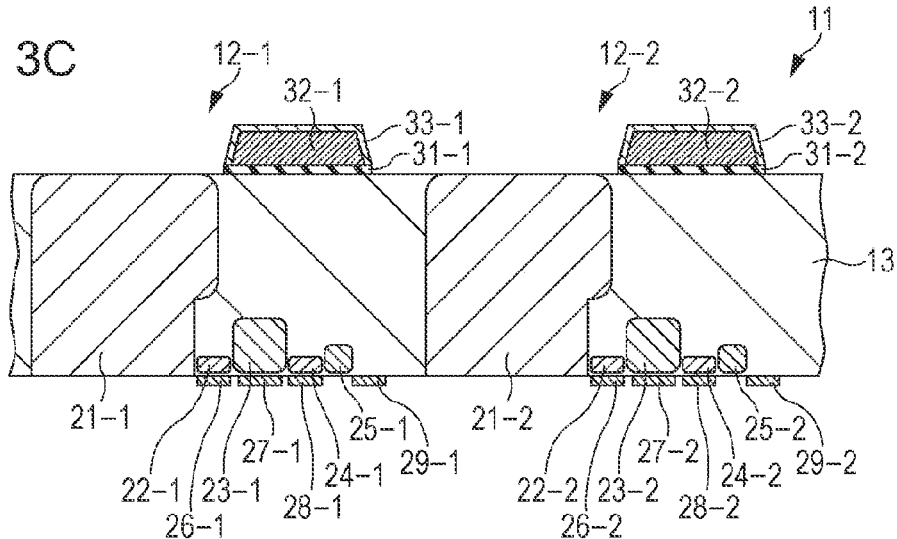

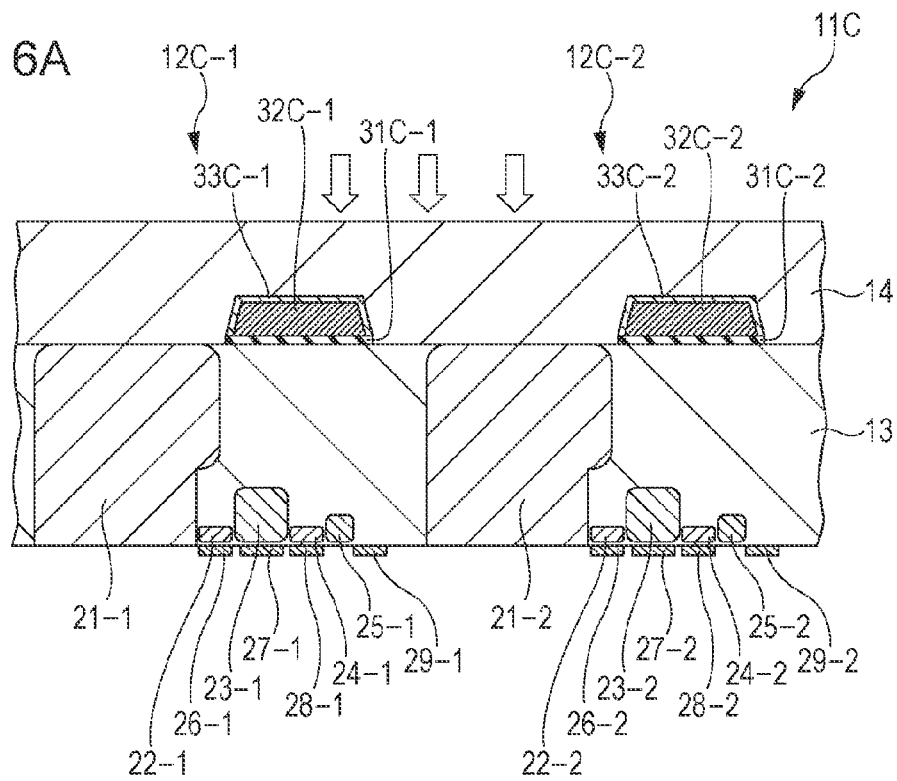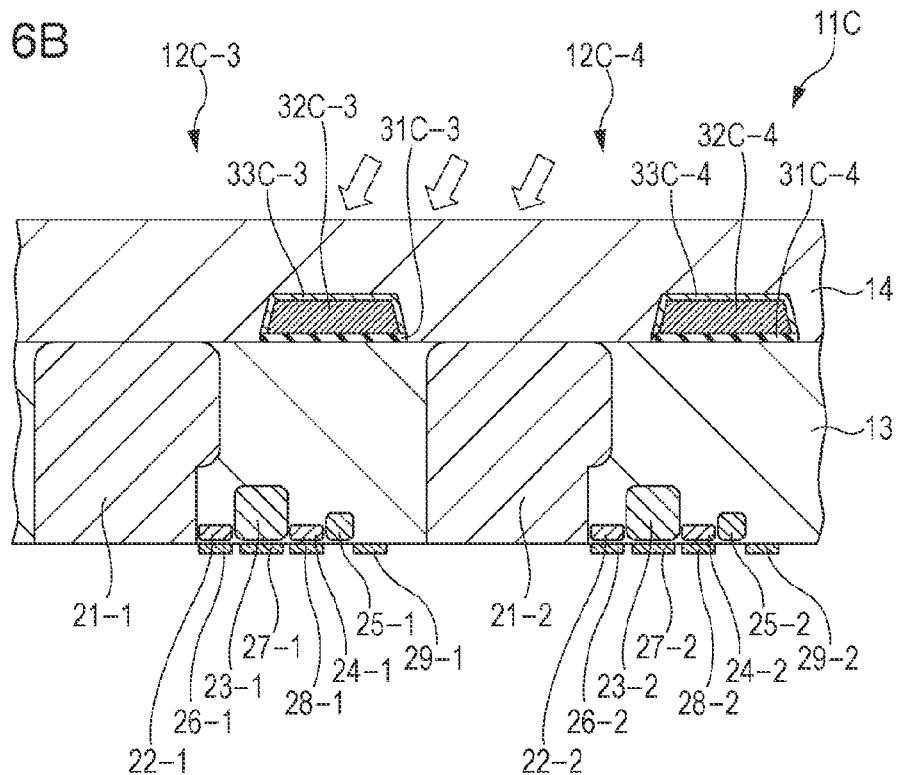

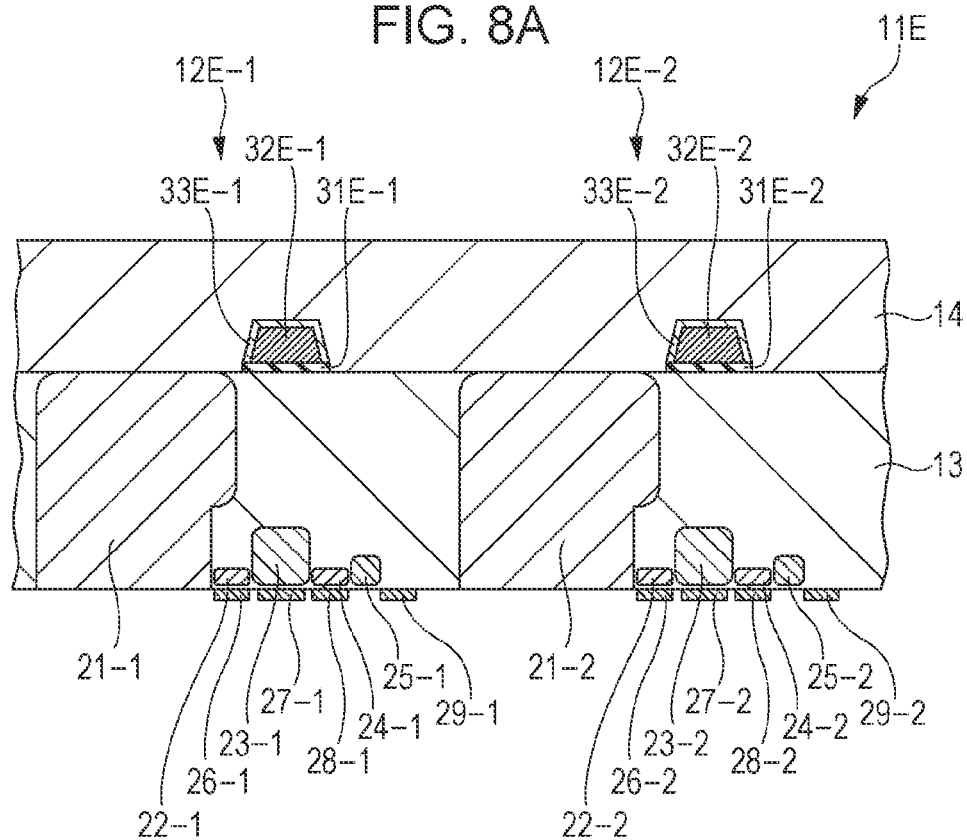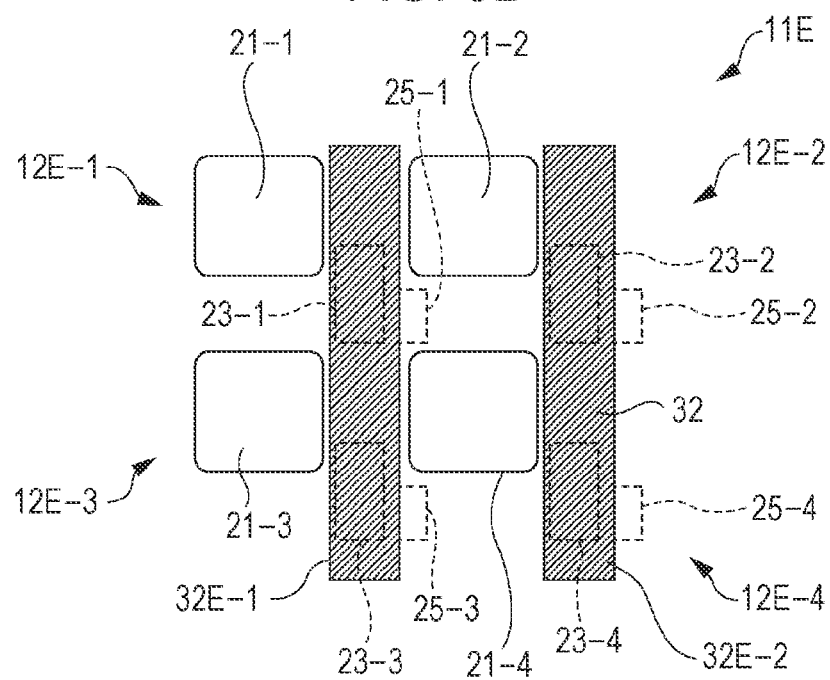

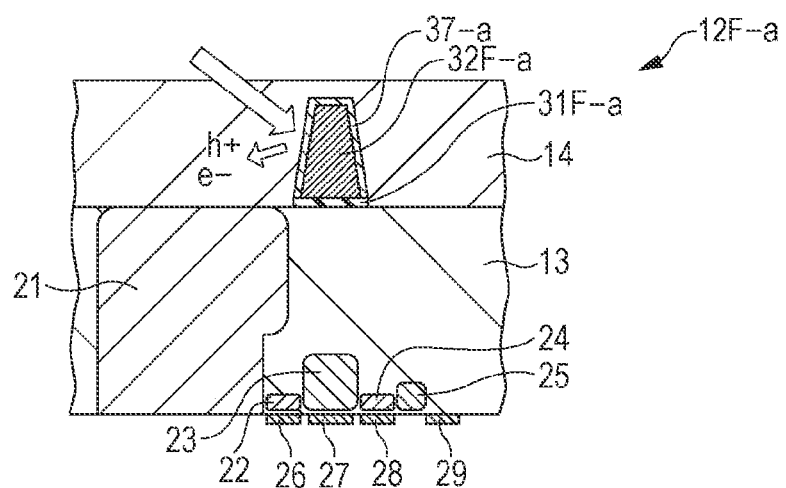
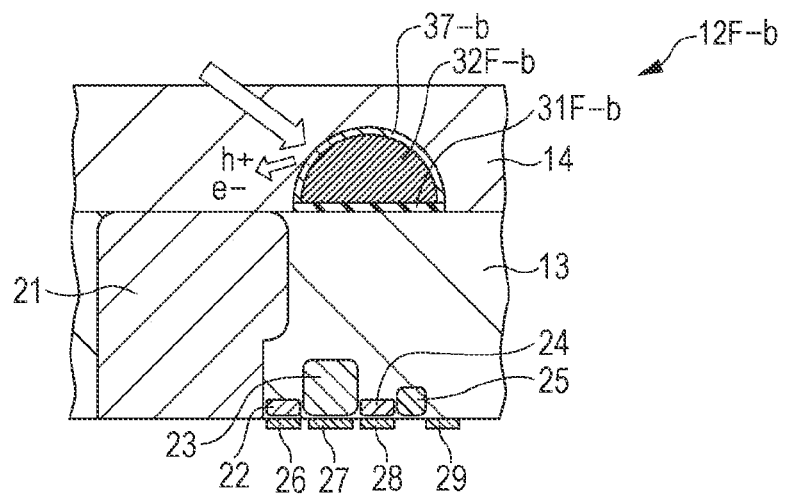
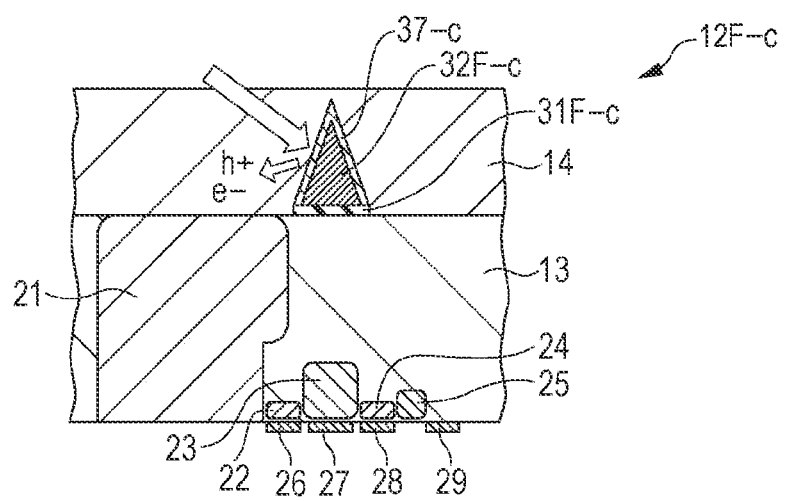

SOLID-STATE IMAGING DEVICE, METHOD OF MANUFACTURING SOLID-STATE IMAGING DEVICE, AND ELECTRONIC APPARATUS

CROSS REFERENCE TO RELATED APPLICATIONS

This application claims the benefit of Japanese Priority Patent Application JP 2013-218065 filed Oct. 21, 2013, the entire contents of which are incorporated herein by reference.

BACKGROUND

The present disclosure relates to a solid-state imaging device, a method of manufacturing the solid-state imaging device, and an electronic apparatus, and, particularly to, a solid-state imaging device, of which the height can be decreased, a method of manufacturing the solid-state imaging device, and an electronic apparatus.

Up to now, in an electronic apparatus which includes an imaging function, such as a digital still camera or a digital video camera, for example, a solid-state imaging device, such as a Charge Coupled Device (CCD) or a Complementary Metal Oxide Semiconductor (CMOS) image sensor, has been used. The solid-state imaging device includes photodiodes (PDs) that perform photoelectric conversion, and pixels in which a plurality of transistors are combined. An image is constructed based on pixel signals which are output from a plurality of pixels arranged in a planar manner.

In addition, a CMOS image sensor according to the related art is driven using a rolling shutter method of reading the pixel signals sequentially for each pixel row by transmitting electrical charge from the PDs. In contrast, in recent years, a CMOS image sensor has been developed which can be driven by a global shutter method of reading the pixel signals sequentially for each pixel row by transmitting an electrical charge from the entire PDs at approximately the same timing and holding the electrical charge in the memory sections which are provided for the respective pixels. In such a CMOS image, a light shielding property is necessary for the memory sections which are formed on a silicon substrate.

In contrast, a solid-state imaging device that has a structure, in which a photoelectric conversion film (for example, CuInGaS2 (Copper Indium Gallium DiSelenide (CIGS)) film) is laminated on the silicon substrate on which the PDs are formed, has been developed (refer to Japanese Unexamined Patent Application Publication No. 2012-64822 and Japanese Unexamined Patent Application Publication No. 2013-26332).

SUMMARY

However, when the CMOS image sensor, which can be driven using the above-described global shutter method, is configured to use the structure in which the photoelectric conversion film is laminated on the silicon substrate, light is absorbed by the photoelectric conversion film, and thus it is possible to shield light from reaching the memory sections which are formed on the silicon substrate. That is, a solid-state imaging device that includes a structure in which the photoelectric conversion film has a light shielding property for the memory sections has been developed. Further, in order to improve the light shielding property of the photoelectric conversion film, it is effective to make the film thickness of the photoelectric conversion film be thick.

However, for example, when the memory sections are caused to be completely shielded by the photoelectric conversion film formed of CIGS, a film thickness of 1 µm or greater is necessary. Due to the thick film thickness, the loads of a deposition and manufacturing process increase. Further, if the thickness of the solid-state imaging device increases (height increases), the degree of freedom is deteriorated when the solid-state imaging device is built as a finalized product.

It is desirable to realize a solid-state imaging device decreased in height.

According to an embodiment of the present disclosure, there is provided a solid-state imaging device including: a semiconductor substrate that is formed with a photodiode for each pixel; a light shielding film that is laminated on the semiconductor substrate on a side of a light irradiated surface which is irradiated with light, and is formed to include an opening corresponding to a spot in which at least the photodiode is arranged; and a photoelectric conversion film that is laminated to cover the light irradiated surface of the semiconductor substrate and the light shielding film, and is configured to generate an electrical charge by absorbing light. The photoelectric conversion film is formed of a material which has higher light absorptivity than light absorptivity of the semiconductor substrate.

According to another embodiment of the present disclosure, there is provided a method of manufacturing a solid-state imaging device, the method including: laminating a light shielding film, formed to include an opening corresponding to a spot in which at least a photodiode is arranged, on a light irradiated surface, which is irradiated with light, of a semiconductor substrate that is formed with the photodiode for each pixel; and laminating a photoelectric conversion film, configured to generate an electrical charge by absorbing light, to cover the light irradiated surface of the semiconductor substrate and the light shielding film. The photoelectric conversion film is formed of a material which has higher light absorptivity than light absorptivity of the semiconductor substrate.

According to still another embodiment of the present disclosure, there is provided an electronic apparatus including a solid-state imaging device which includes: a semiconductor substrate that is formed with a photodiode for each pixel; a light shielding film that is laminated on the semiconductor substrate on a side of a light irradiated surface which is irradiated with light, and is formed to include an opening corresponding to a spot in which at least the photodiode is arranged; and a photoelectric conversion film that is laminated to cover the light irradiated surface of the semiconductor substrate and the light shielding film, and is configured to generate an electrical charge by absorbing light. The photoelectric conversion film is formed of a material which has higher light absorptivity than light absorptivity of the semiconductor substrate.

According to the embodiments of the present disclosure, a light shielding film, formed to include an opening corresponding to a spot in which at least a photodiode is arranged, is laminated on a light irradiated surface, which is irradiated with light, of a semiconductor substrate that is formed with the photodiode for each pixel, and a photoelectric conversion film, configured to generate an electrical charge by absorbing light, is laminated to cover the light irradiated surface of the semiconductor substrate and the light shielding film. Further, the photoelectric conversion film is formed of a material which has higher light absorptivity than light absorptivity of the semiconductor substrate.

According to the embodiments of the present disclosure, it is possible to realize a solid-state imaging device decreased in height.

BRIEF DESCRIPTION OF THE DRAWINGS

FIGS. 3A to 3C are diagrams illustrating fourth to sixth processes in the method of manufacturing a solid-state imaging device;

FIGS. 6A and 6B are diagrams illustrating an example of the configuration of a solid-state imaging device according to a fourth embodiment;

FIGS. 8A and 8B are diagrams illustrating an example of the configuration of a solid-state imaging device according to a sixth embodiment;

FIGS. 10A to 10C are diagrams illustrating solid-state imaging devices which include pixels having different-shaped light shielding films according to a modification example;

DETAILED DESCRIPTION OF EMBODIMENTS

Hereinafter, embodiments to which the present disclosure is applied will be described in detail with reference to the accompanying drawings.

Figure 1A:
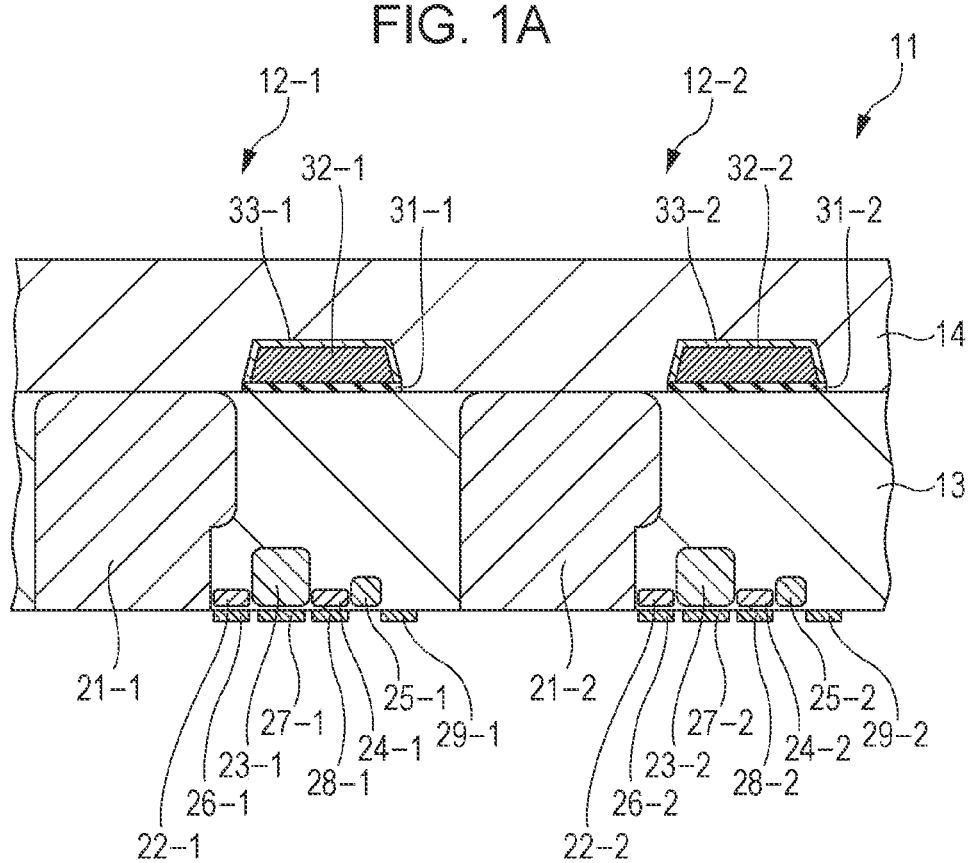
FIGS. 1A and 1B are diagrams illustrating an example of the configuration of a solid-state imaging device according to a first embodiment of the present disclosure.
Figure 1B:
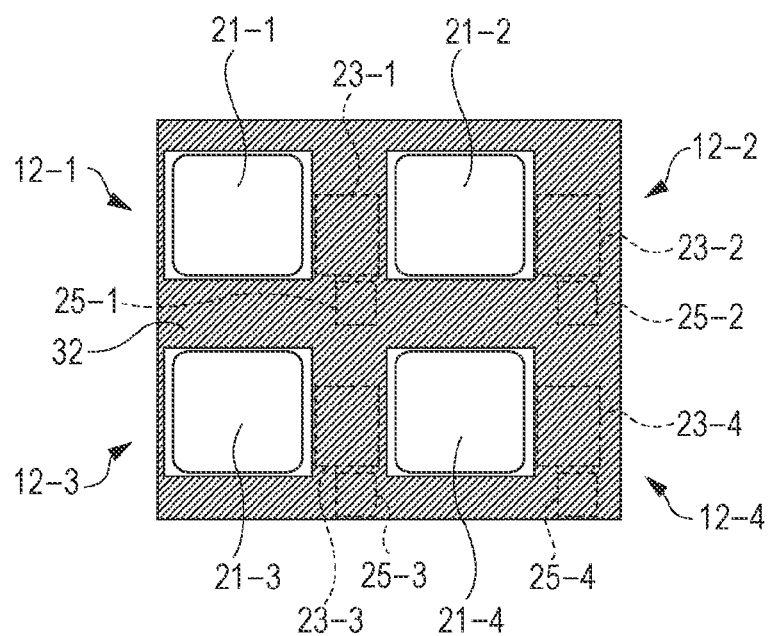

FIGS. 1A and 1B are diagrams illustrating an example of the configuration of a solid-state imaging device according to a first embodiment of the present disclosure. FIG. 1A illustrates an example of the cross-sectional configuration of the solid-state imaging device, and FIG. 1B illustrates an example of the planar configuration of the solid-state imaging device.

A solid-state imaging device 11 includes a plurality of pixels 12 which are arranged in a planar array shape. FIG. 1A illustrates the cross-sectional configuration of a region where two pixels 12-1 and 12-2 are arranged, and FIG. 1B illustrates the planar configuration of a region where four pixels 12-1 to 12-4 are arranged. Meanwhile, hereinafter, when it is not necessary to distinguish between the respective pixels 12-1 to 12-4, the pixels 12-1 to 12-4 are simply called a pixel 12 appropriately. In addition, it is similar in each of the sections which are included in the pixel 12. Further, the surface of the solid-state imaging device 11 is irradiated with light, which faces the upper side in FIG. 1A, and the surface is appropriately called a "light irradiated surface" below. In addition, wiring layers which are not shown in the drawing are laminated on another surface of the solid-state imaging device 11, which faces the lower side in FIG. 1A, and the surface is appropriately called a "wiring layer-laminated surface".

As shown in FIG. 1A, the solid-state imaging device 11 includes a photoelectric conversion film 14 which is laminated on a semiconductor substrate 13.

The semiconductor substrate 13 is, for example, a silicon wafer acquired by thinly slicing a single crystal of high-purity silicon. The inside of the semiconductor substrate 13 is formed with a PD 21, a channel region 22, a memory section 23, a channel region 24, and a Floating Diffusion (FD) section 25 for each pixel 12. Further, on the wiring layer-laminated surface of the semiconductor substrate 13, a gate electrode 26, an electrode 27, a gate electrode 28, and a gate electrode 29 are laminated through an insulating layer which is not shown in the drawing.

In addition, an insulating film 31, a light shielding film 32, and a low reflection film 33 are laminated on the light irradiated surface of the semiconductor substrate 13 for each pixel 12, and the photoelectric conversion film 14 is formed thereon.

The photoelectric conversion film 14 is laminated to cover the entire surface of the light irradiated surface of the semiconductor substrate 13 and the light shielding film 32 which is laminated on the semiconductor substrate 13 in a region where the pixel 12 is arranged on the semiconductor substrate 13, is configured to perform photoelectric conversion on light with which the solid-state imaging device 11 is irradiated, and is configured to generate an electrical charge for each pixel 12 according to the amount of received light. Further, in the solid-state imaging device 11, a material (a kind of film) which has higher light absorptivity than silicon may be used as the photoelectric conversion film 14 in addition to silicon (Si). That is, it is possible to use, for example, a compound which includes a plurality of elements, such as GaAs, InP, CuInGaS, CuInGaSe, AgInGaSe2, FeS2, Cu2S, SnS2, BaSi2, GaP and InGaP, as the photoelectric conversion film 14.

The PD 21 includes, for example, an n-type region which is formed through ion implantation of n-type impurities into the P-type semiconductor substrate 13, and performs photoelectric conversion through a pn junction. In addition, at least a part of the n-type region which is included in the PD 21 extends toward the wiring layer-laminated surface of the semiconductor substrate 13, and is formed to be adjacent to the channel region 22. The n-type region which extends to be adjacent to the channel region 22 as described above is a path which transmits the electrical charge generated in the PD 21 and the electrical charge generated in the photoelectric conversion film 14 connected to the PD 21.

The channel region 22 is formed on the side of the wiring layer-laminated surface of the semiconductor substrate 13 to be adjacent to the PD 21, and forms a path for transmitting the electrical charge from the PD 21 to the memory section 23.

The memory section 23 is formed on the side of the wiring layer-laminated surface of the semiconductor substrate 13 to be adjacent to the channel region 22, and temporarily holds the electrical charge transmitted from the PD 21 through the channel region 22.

The channel region 24 is formed on the side of the wiring layer-laminated surface of the semiconductor substrate 13 to be adjacent to the memory section 23 and forms a path for transmitting the electrical charge from the memory section 23 to the FD section 25.

The FD section 25 is connected to an amplification transistor which is not shown in the drawing, is a floating diffusion region which includes a predetermined electrical charge capacity, and temporarily accumulates an electrical charge which is transmitted from the PD 21. In addition, the FD section 25 is an electrical charge detection section which converts an electrical charge into a voltage, and an electrical charge which is accumulated in the FD section 25 is converted into a voltage in the amplification transistor.

The gate electrode 26 is arranged in a location corresponding to the channel region 22, and is included in a transmission transistor which transmits an electrical charge from the PD 21 to the memory section 23. For example, when a predetermined electrical potential is applied to the gate electrode 26, an electrical charge which is accumulated in the PD 21 is transmitted to the memory section 23 through the channel region 22. In addition, in the solid-state imaging device 11, for example, the electrical charge is transmitted from the PD 21 to the memory section 23 in the entire pixel 12 at approximately the same timing.

The electrode 27 is arranged in a location corresponding to the memory section 23. When a predetermined electrical potential is applied to the electrode 27, the potential of the memory section 23 is deeper, thereby assisting the transmission of the electrical charge from the PD 21.

The gate electrode 28 is arranged in a location corresponding to the channel region 24, and is included in the transmission transistor which transmits an electrical charge from the memory section 23 to the FD section 25. For example, when the predetermined electrical potential is applied to the gate electrode 28, an electrical charge which is accumulated in the memory section 23 is transmitted to the FD section 25 through the channel region 24. In addition, in the solid-state imaging device 11, for example, an electrical charge is sequentially transmitted from the memory section 23 to the FD section 25 for every column of the pixel 12, and thus a pixel signal is read.

The gate electrode 29 is arranged in a location which is adjacent to the FD section 25, and is included in a reset transistor which resets the FD section 25 by discharging an electrical charge accumulated in the FD section 25. For example, when a predetermined electrical potential is applied to the gate electrode 29, an electrical charge accumulated in the FD section 25 is discharged into a power supply voltage which is not shown in the drawing.

The insulating film 31 is formed of, for example, an oxide film which has an insulation property, is laminated on the light irradiated surface of the semiconductor substrate 13, and insulates the semiconductor substrate 13 from the light shielding film 32.

The light shielding film 32 is laminated on the semiconductor substrate 13 through the insulating film 31. The light shielding film 32 is formed of, for example, metal, such as tungsten (W), which has a light shielding property. In addition, the light shielding film 32 is provided with an opening corresponding to a region where the PD 21 is arranged as shown in FIG. 1B, and shields each of the sections other than the PD 21, for example, the memory section 23 and the FD section 25.

The low reflection film 33 is a film which has low light reflectance, is formed to cover the light shielding film 32, and suppresses the reflection of light with which the light shielding film 32 is irradiated.

The solid-state imaging device 11 which is configured as described above has a structure which is provided with the light shielding film 32, and thus it is possible to make the photoelectric conversion film 14 be thin compared to a structure in which light shielding with regard to the memory section 23 is performed by only the photoelectric conversion film 14. In addition, in the solid-state imaging device 11, a kind of film, which has higher light absorptivity than silicon, is used as the photoelectric conversion film 14, and thus it is possible to make the photoelectric conversion film 14 be thin, compared to the configuration in which silicon is used as the photoelectric conversion film 14.

For example, as described above, in order to completely perform light shielding on the memory section 23 using the photoelectric conversion film formed of CIGS, a film thickness of 1 μm or greater is necessary. In contrast, in the solid-state imaging device 11, the light shielding film 32 is provided and a kind of film, which has higher light absorptivity than silicon, is used as the photoelectric conversion film 14, and thus it is possible to securely perform light shielding on the memory section 23 even when the film thickness is less than 1 μm.

As described above, as the thickness of the photoelectric conversion film 14 is thinned, it is possible to decrease the height of the solid-state imaging device 11. For example, it is possible to improve the degree of freedom when the solid-state imaging device 11 is inserted into an electronic apparatus or the like.

In addition, in the solid-state imaging device 11, the light shielding film 32 is configured to be covered by the low reflection film 33, and thus it is possible to suppress costs incurred when light, which is reflected in the light shielding film 32, is reflected by an optical system which is not shown in the drawing.

In addition, the solid-state imaging device 11 has a configuration in which the entire light irradiated surface of the semiconductor substrate 13 is covered by the photoelectric conversion film 14, photoelectric conversion is performed on the photoelectric conversion film 14 in addition to the PD 21, and thus it is possible to improve the sensitivity of the pixel 12. Further, the surface of the photoelectric conversion film 14 is formed in a flat shape, and thus it is possible to easily process a filter (not shown in the drawing) or the like which is laminated on the photoelectric conversion film 14 and it is possible to improve the sensitivity thereof.

Subsequently, a method of manufacturing the solid-state imaging device 11 will be described with reference to FIGS. 2A to 3C.

Figure 2A:
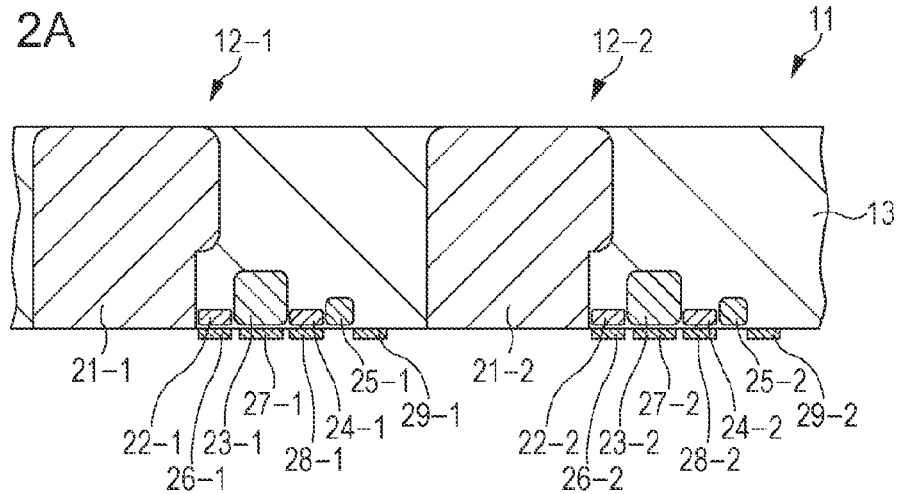
FIGS. 2A to 2C are diagrams illustrating first to third processes in a method of manufacturing a solid-state imaging device.

First, in a first process, as shown in FIG. 2A, the PD 21, the channel region 22, the memory section 23, the channel region 24, and the FD section 25 are formed on the semiconductor substrate 13 for each pixel 12. In addition, the gate electrode 26, the electrode 27, the gate electrode 28, and the gate electrode 29 are formed to be laminated on the wiring layer-laminated surface of the semiconductor substrate 13 through the insulating layer which is not shown in the drawing. Further, the back surface (back side surface acquired when it is assumed that the surface on which the wiring layer is laminated is a front surface) of the semiconductor substrate 13 is polished such that the PD 21 appears on the side of the light irradiated surface of the semiconductor substrate 13.

Figure 2B:
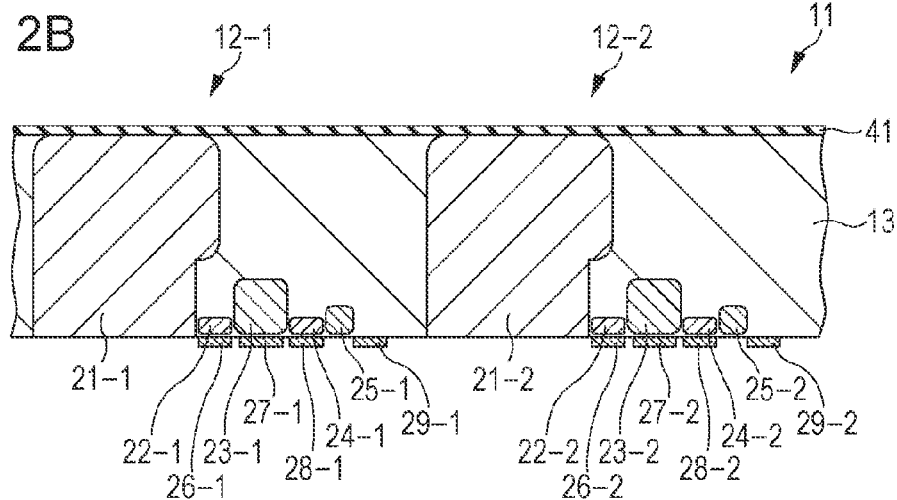

In a second process, as shown in FIG. 2B, a material corresponding to the insulating film 31 is deposited on one surface of the light irradiated surface of the semiconductor substrate 13, and thus an insulating film layer 41 is formed.

Figure 2C:
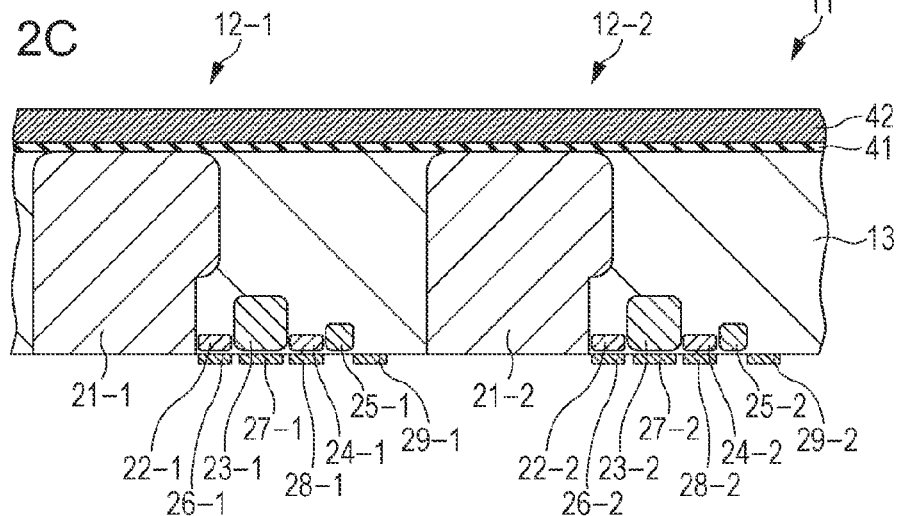

In a third process, as shown in FIG. 2C, a material (for example, tungsten or the like) corresponding to the light shielding film 32 is deposited on one surface of the insulating film layer 41 which is formed in the second process, and thus a light shielding film layer 42 is formed.

In a fourth process, as shown in FIG. 3A, a process (photolithography and dry etching) is performed on the insulating film layer 41 shown in FIG. 2C. Therefore, for example, a portion corresponding to the opening shown in FIG. 1B is removed from the insulating film layer 41, and thus the light shielding film 32 is formed.

In a fifth process, as shown in FIG. 3B, a material corresponding to the low reflection film 33 is deposited on outer surfaces of the insulating film layer 41 and the light shielding film 32, and thus the low reflection film layer 43 is formed.

In a sixth process, as shown in FIG. 3C, a process (photolithography and dry etching) is performed on the insulating film layer 41 and the low reflection film layer 43, and thus the insulating film 31 and the low reflection film 33 are formed. At this time, it is necessary to perform cleaning in order to prevent damage which may occur when the insulating film layer 41 is removed from the light irradiated surface of the semiconductor substrate 13.

Thereafter, when the photoelectric conversion film 14 is laminated on the entire surface on the side of the light irradiated surface of the semiconductor substrate 13 and a process to planarize the surface of the photoelectric conversion film 14 is performed, the solid-state imaging device 11, as shown in FIGS. 1A and 1B is manufactured.

Figure 4:
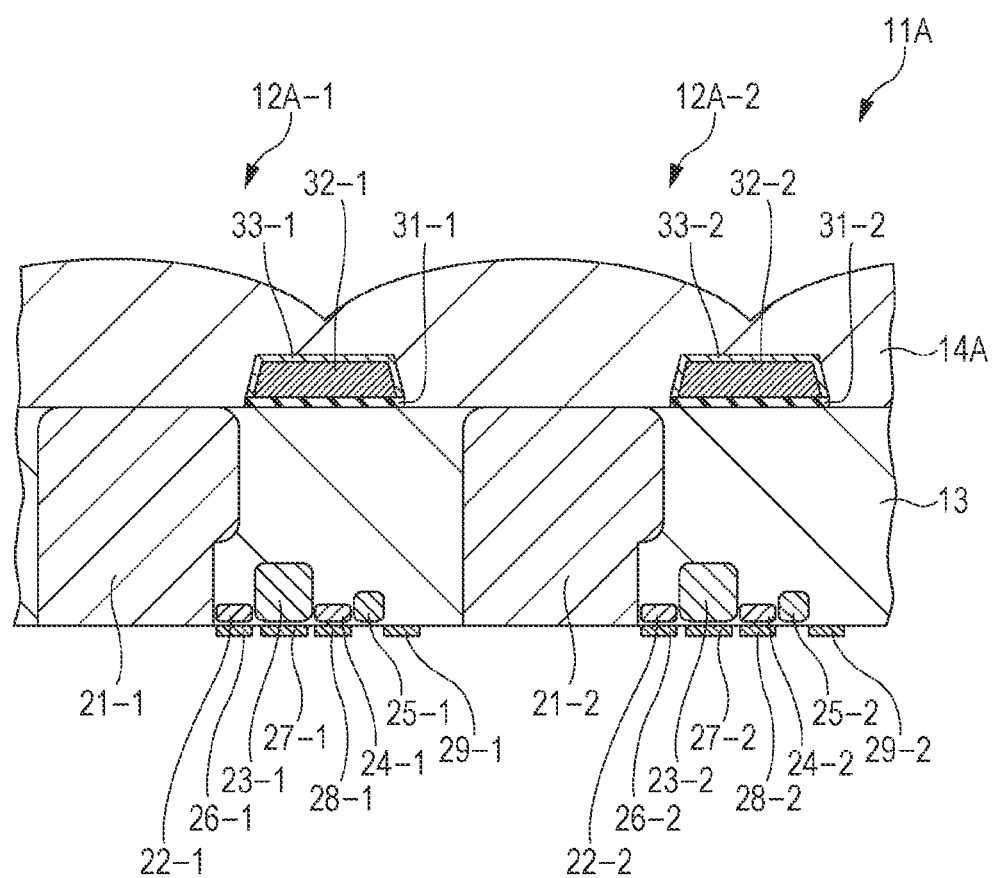
FIG. 4 is a diagram illustrating an example of the configuration of a solid-state imaging device according to a second embodiment.

Subsequently, FIG. 4 is a diagram illustrating an example of the configuration of a solid-state imaging device according to a second embodiment. Meanwhile, in a solid-state imaging device 11A shown in FIG. 4, the same reference numerals are used to indicate the same components of the solid-state imaging device 11 shown in FIGS. 1A and 1B, and the detailed description thereof will not be repeated.

As shown in FIG. 4, the solid-state imaging device 11A is configured to be the same as the solid-state imaging device 11 shown in FIGS. 1A and 1B in that the solid-state imaging device 11A is configured such that a photoelectric conversion film 14A is laminated on a semiconductor substrate 13 and is configured to include a PD 21, a channel region 22, a memory section 23, a channel region 24, an FD section 25, a gate electrode 26, an electrode 27, a gate electrode 28, a gate electrode 29, an insulating film 31, a light shielding film 32, and a low reflection film 33 for each pixel 12A. In contrast, the solid-state imaging device 11A includes the photoelectric conversion film 14A having a shape different from that of the photoelectric conversion film 14 of the solid-state imaging device 11 shown in FIGS. 1A and 1B.

That is, in the solid-state imaging device 11 shown in FIGS. 1A and 1B, the surface of the photoelectric conversion film 14 is formed to be planarized. In contrast, in the solid-state imaging device 11A, the surface of the photoelectric conversion film 14A is formed to be a curved surface that is convex upward for each pixel 12A. More specifically, in the solid-state imaging device 11 shown in FIGS. 1A and 1B, the process to planarize the surface of the photoelectric conversion film 14 is performed after the photoelectric conversion film 14 is deposited. In contrast, in the solid-state imaging device 11A, the photoelectric conversion film 14A is formed while the process to planarize the surface of the photoelectric conversion film 14A is not performed.

That is, when the photoelectric conversion film 14A is deposited, the photoelectric conversion film 14A is deposited such that the photoelectric conversion film 14A extends from the surface of the semiconductor substrate 13. Therefore, the photoelectric conversion film 14A is deposited after the surface of the semiconductor substrate 13 in a region where the low reflection film 33 is formed. Therefore, the photoelectric conversion film 14A is formed to have thick thickness in a region where the surface of the semiconductor substrate 13 is exposed and to have thin thickness in a region where the low reflection film 33 is formed. Meanwhile, the shape of the photoelectric conversion film 14A can be controlled according to process conditions, and it is possible to deposit the photoelectric conversion film 14A to have various shapes, such as a shape which is nearly vertical and a shape which has a small inclination angle.

Similar to the solid-state imaging device 11 shown in FIGS. 1A and 1B, the solid-state imaging device 11A, which is configured as described above, is provided with the light shielding film 32 and is configured to use a material which has a high absorption coefficient for the photoelectric conversion film 14A, and thus it is possible to make the photoelectric conversion film 14 thin and decrease the solid-state imaging device 11A in height.

Figure 5:
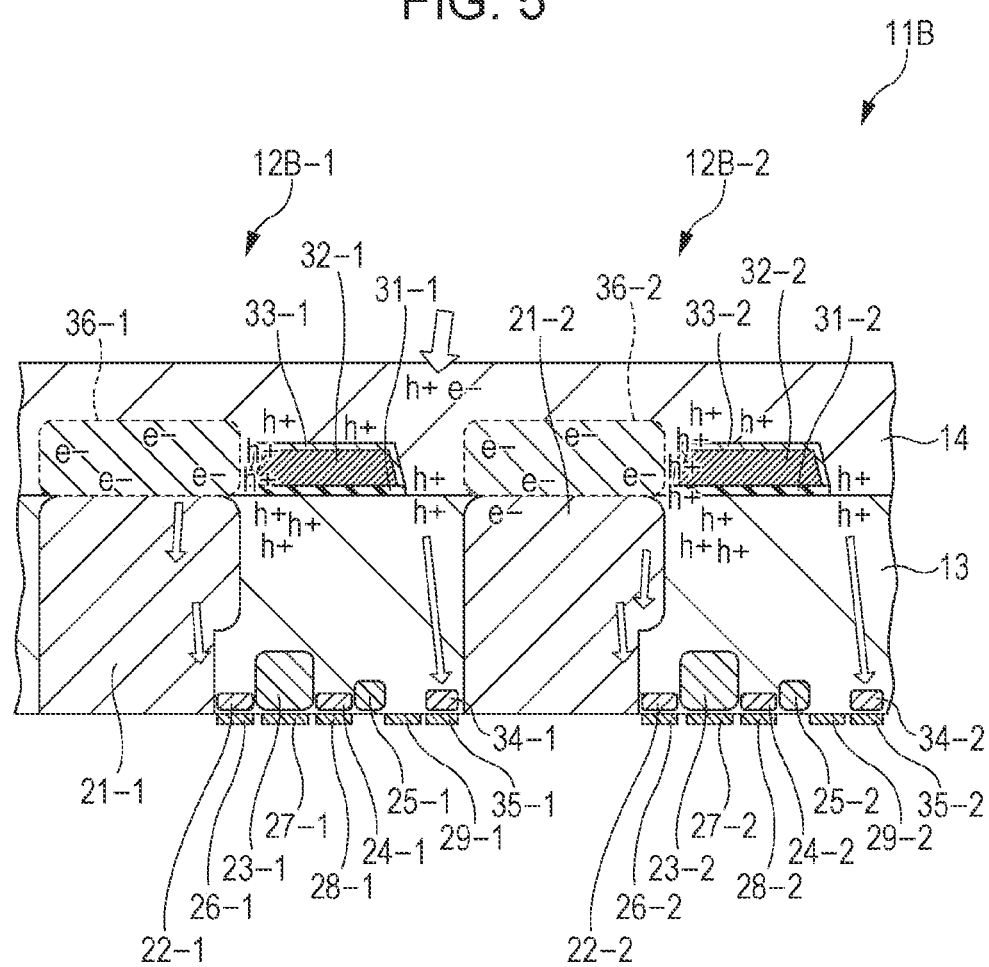
FIG. 5 is a diagram illustrating an example of the configuration of a solid-state imaging device according to a third embodiment.

Subsequently, FIG. 5 is a diagram illustrating an example of the configuration of a solid-state imaging device according to a third embodiment. Meanwhile, in a solid-state imaging device 11B shown in FIG. 5, the same reference numerals are used to indicate the same components of the solid-state imaging device 11 shown in FIGS. 1A and 1B, and the detailed description thereof will not be repeated.

As shown in FIG. 5, the solid-state imaging device 11B is configured to be the same as the solid-state imaging device 11 shown in FIGS. 1A and 1B in that the solid-state imaging device 11B is configured such that a photoelectric conversion film 14 is laminated on a semiconductor substrate 13 and is configured to include a PD 21, a channel region 22, a memory section 23, a channel region 24, an FD section 25, a gate electrode 26, an electrode 27, a gate electrode 28, a gate electrode 29, an insulating film 31, a light shielding film 32, and a low reflection film 33 for each pixel 12B.

In contrast, the solid-state imaging device 11B is configured differently compared to the solid-state imaging device 11 shown in FIGS. 1A and 1B in that a P-type region 34, which is a region (diffusion layer) having a higher concentration of P-type impurities than the semiconductor substrate 13, is formed on the side of the wiring layer-laminated surface of the inside of the semiconductor substrate 13, and in that the electrode 35 corresponding to the P-type region 34 is laminated on the wiring layer-laminated surface of the semiconductor substrate 13. Further, the solid-state imaging device 11B is configured differently compared to the solid-state imaging device 11 shown in FIGS. 1A and 1B in that a negative bias is applied to the light shielding film 32 and the electrode 35.

That is, the solid-state imaging device 11B is configured such that it is possible to apply an electrical potential gradient to the photoelectric conversion film 14 by applying the negative bias to the light shielding film 32. Therefore, a p-region is formed in the vicinity of the light shielding film 32. In contrast, a depletion layer 36 is formed to be widened from the n type of the semiconductor substrate 13 in the central region of the opening of the light shielding film 32. Further, when the negative bias is applied (or GND) to the electrode 35 on the wiring layer-laminated surface of the semiconductor substrate 13, electron holes (h+) in the vicinity of the light shielding film 32 assist in passing through the semiconductor substrate 13 and escaping into the P-type region 34, and thus it is easy to collect electrons (e−) in the PD 21. Therefore, in the solid-state imaging device 11B, it is possible to acquire high sensitivity in the pixel 12B. Further, a pinning effect is generated on the surface of the semiconductor substrate 13, and thus it is possible to reduce noise on the side of the semiconductor substrate 13 in the solid-state imaging device 11B.

In addition, similar to the solid-state imaging device 11 shown in FIGS. 1A and 1B, the solid-state imaging device 11B is provided with the light shielding film 32 and is configured to use a material which has a high absorption coefficient for the photoelectric conversion film 14, and thus it is possible to make the photoelectric conversion film 14 thin and decrease the solid-state imaging device 11B in height.

Meanwhile, instead of the configuration in which the solid-state imaging device 11B is provided with the P-type region 34 and the electrode 35 for each pixel 12B, for example, a configuration may be provided in which a series of contact layers is formed in the peripheral region of the solid-state imaging device 11B, and a negative bias is applied to the contact layers.

Subsequently, FIGS. 6A and 6B are diagrams illustrating an example of the configuration of a solid-state imaging device according to a fourth embodiment. Meanwhile, in a solid-state imaging device 11C shown in FIGS. 6A and 6B, the same reference numerals are used to indicate the same components of the solid-state imaging device 11 shown in FIGS. 1A and 1B, and the detailed description thereof will not be repeated.

FIG. 6A illustrates an example of the cross-sectional configuration of pixels 12C-1 and 12C-2 which are arranged at the center of the solid-state imaging device 11C, and FIG. 6B illustrates an example of the cross-sectional configuration of pixels 12C-3 and 12C-4 which are arranged in the vicinity of the ends of the solid-state imaging device 11C.

In addition, in FIGS. 6A and 6B, the direction of light with which the light irradiated surface of the solid-state imaging device 11C is irradiated is indicated by void arrows. That is, the light irradiated surface is irradiated with light in a direction approximately perpendicular to the light irradiated surface at the center of the solid-state imaging device 11C. In contrast, in the vicinity of the end section of the solid-state imaging device 11C, the light irradiated surface is irradiated with light in a direction inclined from the direction perpendicular to the light irradiated surface (oblique direction such that light faces from the center to the end section). In this manner, when the directions of irradiation of light are different from each other, a pupil location, based on a lens (not shown in the drawing) which is arranged in the optical system, differs according to the location of the pixel 12C.

Accordingly, the solid-state imaging device 11C is configured such that the arrangement location of the light shielding film 32 with regard to the PD 21 is adjusted according to the incident direction of light, that is, the pupil location. For example, in the vicinity of the end section of the solid-state imaging device 11C, adjustment is performed such that the arrangement location of the light shielding film 32C with regard to the PD 21 moves to a central side. The amount of adjustment to adjust the arrangement location of the light shielding film 32C at this time is appropriately set based on the irradiation angle of light.

In this manner, when the arrangement location of the light shielding film 32C is adjusted based on the location (center or end section) of the pixel 12C, it is possible to perform pupil correction and it is possible to prevent light, with which the PD 21 should be irradiated, from being shielded by the light shielding film 32C in the solid-state imaging device 11C. Therefore, it is possible to prevent the sensitivity of the pixel 12C which is arranged in the vicinity of the end section from being deteriorated.

In addition, similar to the solid-state imaging device 11 shown in FIGS. 1A and 1B, the solid-state imaging device 11C is provided with the light shielding film 32C and is configured to use a material which has a high absorption coefficient for the photoelectric conversion film 14, and thus it is possible to make the photoelectric conversion film 14 be thin and decrease the solid-state imaging device 11C in height.

Figure 7A:
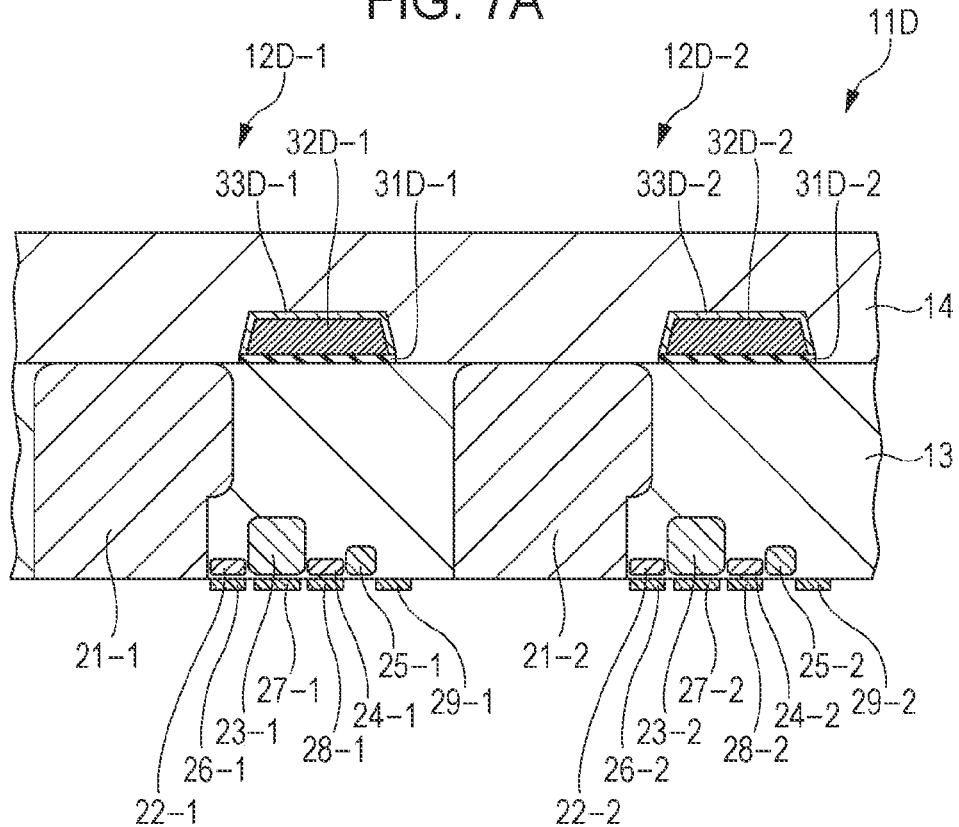
FIGS. 7A and 7B are diagrams illustrating an example of the configuration of a solid-state imaging device according to a fifth embodiment.
Figure 7B:
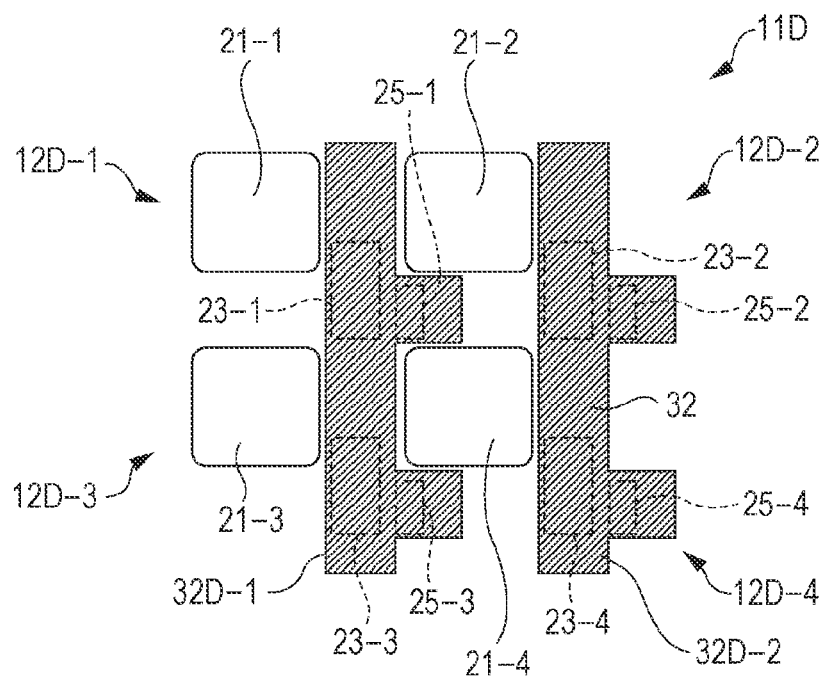

Subsequently, FIGS. 7A and 7B are diagrams illustrating an example of the configuration of a solid-state imaging device according to a fifth embodiment. Meanwhile, in a solid-state imaging device 11D shown in FIGS. 7A and 7B, the same reference numerals are used to indicate the same components of the solid-state imaging device 11 shown in FIGS. 1A and 1B, and the detailed description thereof will not be repeated.

FIG. 7A illustrates an example of the cross-sectional configuration of a solid-state imaging device 11D, and FIG. 7B illustrates an example of the planar configuration of the solid-state imaging device 11D.

As shown in FIGS. 7A and 7B, the solid-state imaging device 11D is configured to be the same as the solid-state imaging device 11 shown in FIGS. 1A and 1B in that the solid-state imaging device 11D is configured such that a photoelectric conversion film 14 is laminated on a semiconductor substrate 13 and is configured to include a PD 21, a channel region 22, a memory section 23, a channel region 24, an FD section 25, a gate electrode 26, an electrode 27, a gate electrode 28, and a gate electrode 29 for each pixel 12D. In contrast, the solid-state imaging device 11D includes an insulating film 31D, a light shielding film 32D, and a low reflection film 33D, the shapes of which are different from those of the solid-state imaging device 11 shown in FIGS. 1A and 1B.

That is, in the solid-state imaging device 11 shown in FIGS. 1A and 1B, the light shielding film 32 is formed to be open in only a region corresponding to the PD 21. In contrast, in the solid-state imaging device 11D, the light shielding film 32D is formed in a stripe shape (comb shape) in order to shield the memory section 23 which is arranged between the columns of pixels 12D and formed to protrude between the rows of pixels 12D in order to shield the FD section 25. That is, in the solid-state imaging device 11D, the light shielding film 32D is formed to shield at least the memory section 23 and the FD section 25.

For example, the solid-state imaging device 11D is configured to perform a method for reading an electrical charge in which accumulating the electrical charge takes longer in the FD section 25 (for example, compared to that in a solid-state imaging device 11E shown in FIGS. 8A and 8B which will be described later), and thus it is necessary to form the light shielding film 32D to cover the FD section 25.

In the solid-state imaging device 11D which is configured as described above, the light shielding film 32D is formed to deal with the method for reading an electrical charge in which accumulating the electrical charge takes longer in the FD section 25. Therefore, for example, in the solid-state imaging device 11D, it is possible to form the opening of the light shielding film 32D wider compared to that in the solid-state imaging device 11 shown in FIGS. 1A and 1B, and it is possible to improve the sensitivity of the pixel 12D.

In addition, similar to the solid-state imaging device 11 shown in FIGS. 1A and 1B, the solid-state imaging device 11D is provided with the light shielding film 32D and is configured to use a material which has a high absorption coefficient for the photoelectric conversion film 14, and thus it is possible to make the photoelectric conversion film 14 be thin and decrease the solid-state imaging device 11D in height.

Subsequently, FIGS. 8A and 8B are diagrams illustrating an example of the configuration of a solid-state imaging device according to a sixth embodiment. Meanwhile, in a solid-state imaging device 11E shown in FIGS. 8A and 8B, the same reference numerals are used to indicate the same components of the solid-state imaging device 11 shown in FIGS. 1A and 1B, and the detailed description thereof will not be repeated.

FIG. 8A illustrates an example of the cross-sectional configuration of the solid-state imaging device 11E, and FIG. 8B illustrates an example of the planar configuration of the solid-state imaging device 11E.

As shown in FIGS. 8A and 8B, the solid-state imaging device 11E includes an insulating film 31E, a light shielding film 32E, and a low reflection film 33E, the shapes of which are different from those of the solid-state imaging device 11 shown in FIGS. 1A and 1B, similar to the solid-state imaging device 11D shown in FIGS. 7A and 7B.

That is, in the solid-state imaging device 11D shown in FIGS. 7A and 7B, the light shielding film 32D is formed to cover the memory section 23 and the FD section 25. In contrast, in the solid-state imaging device 11E, the light shielding film 32E is formed to cover the memory section 23. That is, in the solid-state imaging device 11E, the light shielding film 32E is formed in a stripe shape (comb shape) in order to shield the memory section 23 which is arranged between the columns of pixel 12E.

For example, the solid-state imaging device 11E may be configured to perform a method for reading an electrical charge in which accumulating the electrical charge takes shorter in the FD section 25 (for example, compared to that in the solid-state imaging device 11D shown in FIGS. 7A and 7B), and the light shielding film 32D may be formed to cover the memory section 23. That is, when the solid-state imaging device 11E is driven to read electrical charge from the entire pixel 12D by a global shutter at approximately the same timing, an electrical charge is held in the memory section 23 and electrical charge is accumulated in the FD section 25 only when the electrical charge is read out.

In the solid-state imaging device 11E which is configured as described above, the light shielding film 32E is formed to deal with the method for reading an electrical charge in which accumulating the electrical charge takes shorter in the FD section 25. Therefore, for example, in the solid-state imaging device 11E, it is possible to form the opening of the light shielding film 32E wider compared to the solid-state imaging device 11 shown in FIGS. 1A and 1B, and it is possible to improve the sensitivity of the pixel 12E.

In addition, similar to the solid-state imaging device 11 shown in FIGS. 1A and 1B, the solid-state imaging device 11E is provided with the light shielding film 32E and is configured to use a material which has a high absorption coefficient for the photoelectric conversion film 14, and thus it is possible to make the photoelectric conversion film 14 be thin and decrease the solid-state imaging device 11E in height.

Figure 9:
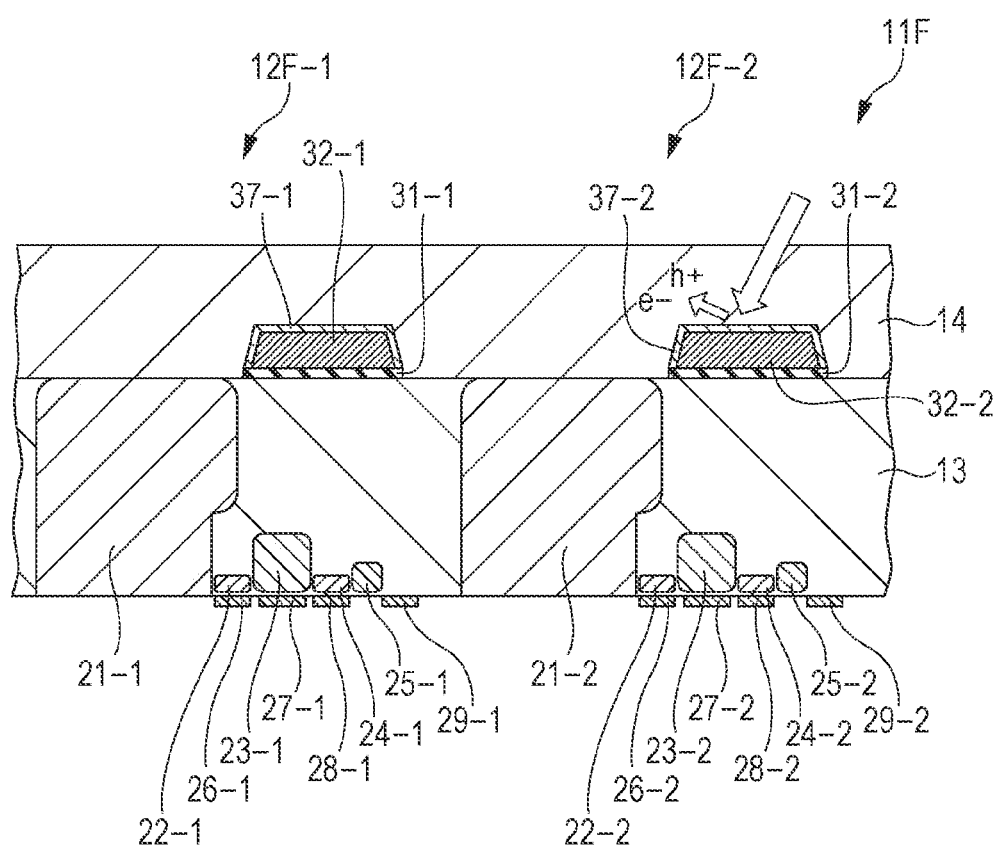
FIG. 9 is a diagram illustrating an example of the configuration of a solid-state imaging device according to a seventh embodiment.

Subsequently, FIG. 9 is a diagram illustrating an example of the configuration of a solid-state imaging device according to a seventh embodiment. Meanwhile, in a solid-state imaging device 11F shown in FIG. 9, the same reference numerals are used to indicate the same components of the solid-state imaging device 11 shown in FIGS. 1A and 1B, and the detailed description thereof will not be repeated.

As shown in FIG. 9, the solid-state imaging device 11F is configured to be the same as the solid-state imaging device 11 shown in FIGS. 1A and 1B in that the solid-state imaging device 11F is configured such that a photoelectric conversion film 14 is laminated on a semiconductor substrate 13 and is configured to include a PD 21, a channel region 22, a memory section 23, a channel region 24, an FD section 25, a gate electrode 26, an electrode 27, a gate electrode 28, a gate electrode 29, an insulating film 31, and a light shielding film 32 for each pixel 12F. In contrast, the solid-state imaging device 11F is configured to include a high reflection film 37, which has high reflectance of light and which is formed to cover the light shielding film 32, instead of the low reflection film 33 of the solid-state imaging device 11 shown in FIGS. 1A and 1B.

That is, the solid-state imaging device 11F is configured such that the high reflection film 37 is deposited on the light shielding film 32. When light is significantly reflected by the high reflection film 37 and photoelectric conversion is performed on the reflected light in the photoelectric conversion film 14, it is possible to improve sensitivity. That is, the photoelectric conversion film 14 absorbs both light which is incident on the high reflection film 37 and light which is reflected in the high reflection film 37, and thus sensitivity is improved. In addition, for example, when the combination of the material and the film thickness of the light shielding film 32 and the material and the film thickness of the photoelectric conversion film 14 is appropriately selected, it is possible to appropriately improve the sensitivity of the solid-state imaging device 11F.

Further, in the solid-state imaging device 11F, it is possible to use the pixel 12F which includes various shapes of light shielding film 32F in order to appropriately reflect incident light. For example, in FIGS. 10A to 10C, a modification example of the solid-state imaging device 11F which includes the pixels 12F having different-shaped light shielding films 32 is illustrated.

For example, FIG. 10A illustrates a pixel 12F-a configured to include a light shielding film 32F-a formed in a wall shape such that the area of a side wall surface is wider than that of the light shielding film 32 of FIG. 9. In addition, FIG. 10B illustrates a pixel 12F-b configured to include a light shielding film 32F-b formed with an approximately semi-circular cross-sectional shape. In addition, FIG. 10C illustrates a pixel 12F-c configured to include a light shielding film 32F-c formed with an approximately triangular cross-sectional shape.

In addition, similar to the solid-state imaging device 11 shown in FIGS. 1A and 1B, the solid-state imaging device 11F is provided with the light shielding film 32 and is configured to use a material which has a high absorption coefficient for the photoelectric conversion film 14, and thus it is possible to make the photoelectric conversion film 14 be thin and decrease the solid-state imaging device 11F in height.

Figure 11:
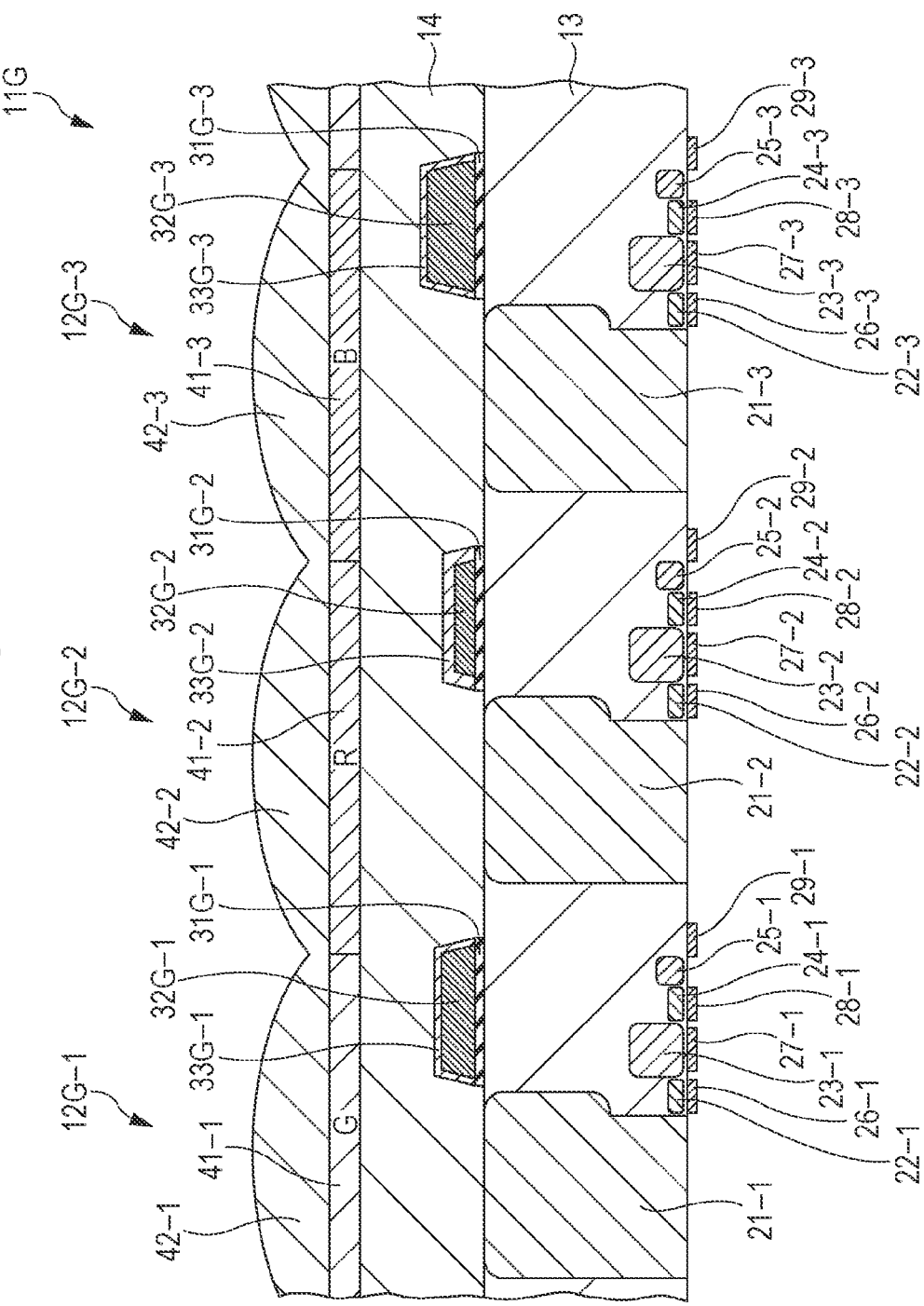
FIG. 11 is a diagram illustrating an example of the configuration of a solid-state imaging device according to an eighth embodiment.

Subsequently, FIG. 11 is a diagram illustrating an example of the configuration of a solid-state imaging device according to an eighth embodiment. Meanwhile, in a solid-state imaging device 11G shown in FIG. 11, the same reference numerals are used to indicate the same components of the solid-state imaging device 11 shown in FIGS. 1A and 1B, and the detailed description thereof will not be repeated.

FIG. 11 illustrates an example of the cross-sectional configuration of the solid-state imaging device 11G in a region in which three pixels 12G-1 to 12G-3 are arranged, and a color filter layer 41 and an on-chip lenses 42 are laminated on the photoelectric conversion film 14. For example, the color filter layer 41 is configured to include filters which are arranged in a planar manner for each pixel 12G in order to pass light of red (R), green (G), or blue (B) therethrough, and the on-chip lenses 42 concentrates incident light for the respective pixels 12G.

As shown in FIG. 11, the solid-state imaging device 11G is configured to be the same as the solid-state imaging device 11 shown in FIGS. 1A and 1B in that the solid-state imaging device 11G is configured such that a photoelectric conversion film 14 is laminated on a semiconductor substrate 13 and is configured to include a PD 21, a channel region 22, a memory section 23, a channel region 24, an FD section 25, a gate electrode 26, an electrode 27, a gate electrode 28, and a gate electrode 29 for each pixel 12G. In contrast, the solid-state imaging device 11G is configured to include an insulating film 31G, a light shielding film 32G, and a high reflection film 33G, the shapes of which are different from those of the solid-state imaging device 11 shown in FIGS. 1A and 1B.

That is, in the solid-state imaging device 11G, the film thickness of the light shielding film 32G, the film thickness of the high reflection film 33G, and a refractive index are optimized for each color of the color filter layer 41 which is arranged to correspond to the pixel 12G. For example, in the example of FIG. 11, in the pixel 12G on which a red filter is arranged in the color filter layer 41, the light shielding film 32G and the high reflection film 33G are formed such that the film thickness of the light shielding film 32G is thin and the film thickness of the high reflection film 33G is thick.

In the solid-state imaging device 11G which is configured as described above, it is possible to efficiently perform conversion on incident light in the photoelectric conversion film 14 in an optimal manner for each pixel 12G.

In addition, similar to the solid-state imaging device 11 shown in FIGS. 1A and 1B, the solid-state imaging device 11G is provided with the light shielding film 32 and is configured to use a material which has a high absorption coefficient for the photoelectric conversion film 14, and thus it is possible to make the photoelectric conversion film 14 be thin and decrease the solid-state imaging device 11G in height.

Subsequently, a variation in the shape of the light shielding film 32 in a structure in which a plurality of pixels 12 share the memory section 23 and the FD section 25 (hereinafter, appropriately referred to as a "pixel sharing structure") will be described with reference to FIGS. 12A to 13B.

Figure 12A:
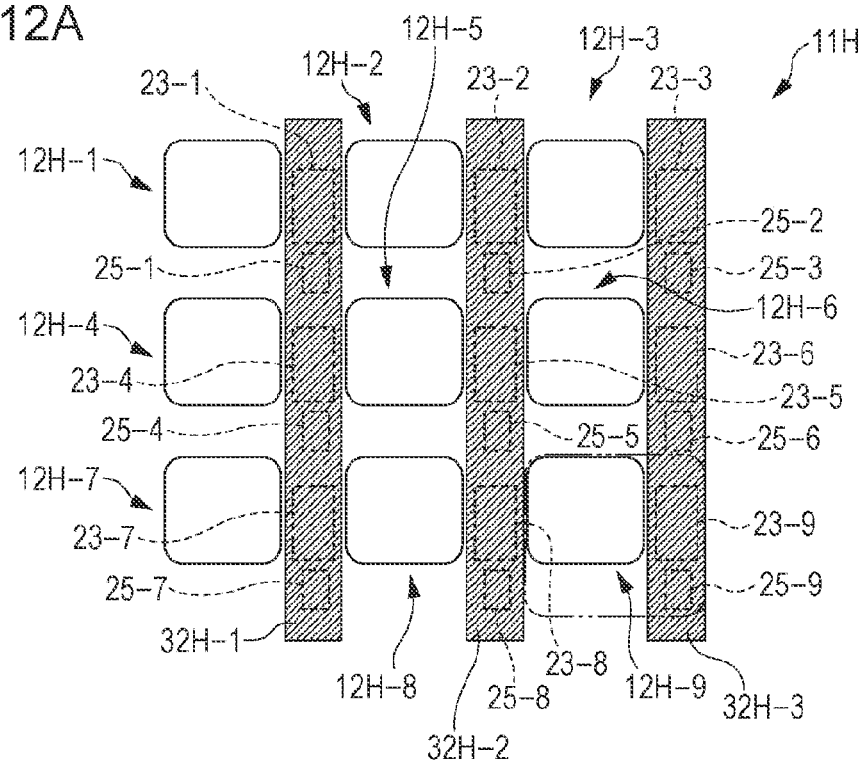
FIGS. 12A and 12B are diagrams illustrating the shape of the light shielding film in a configuration in which a pixel sharing structure is not used.
Figure 12B:
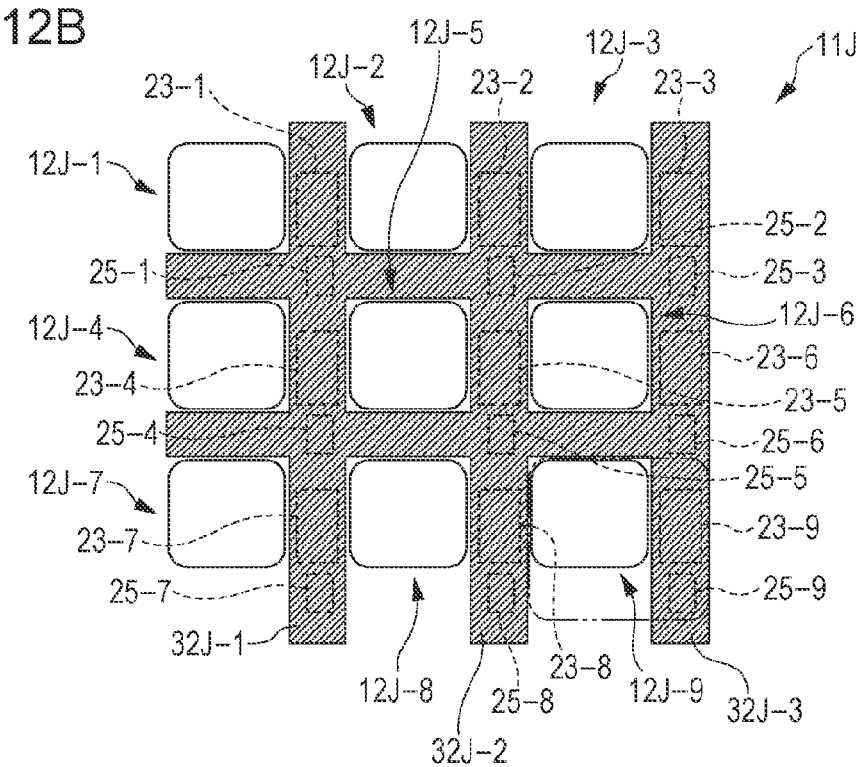
Figure 13A:
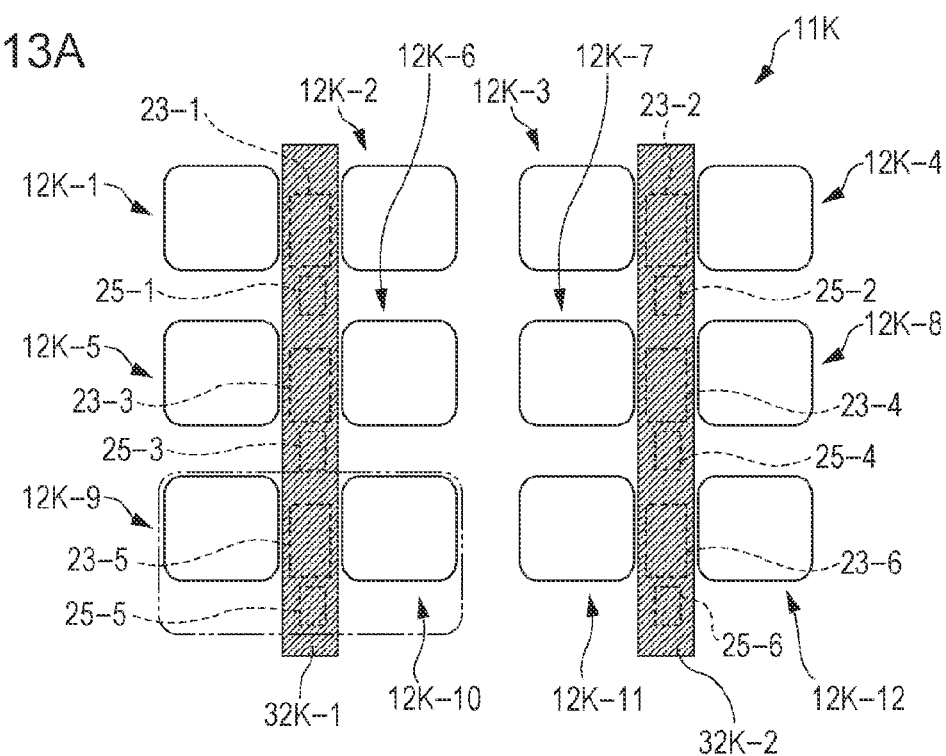
FIGS. 13A and 13B are diagrams illustrating the shapes of the light shielding film in a two-pixel sharing structure and a four-pixel sharing structure.
Figure 13B:
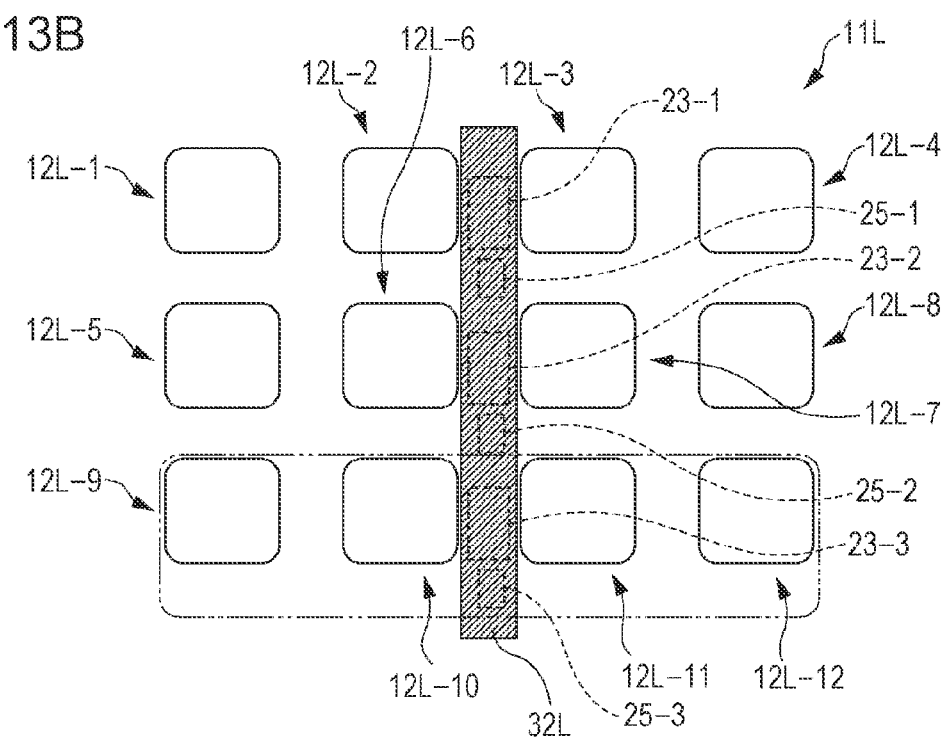

For example, FIGS. 12A and 12B illustrate the shape of the light shielding film 32 in a configuration in which the pixel sharing structure is not used, FIG. 13A illustrates the shape of the light shielding film 32 in a two-pixel sharing structure in which two pixels 12 are shared, and FIG. 13B illustrates the shape of the light shielding film 32 in a four-pixel sharing structure in which four pixels 12 are shared.

FIG. 12A illustrates an example of the planar configuration of a solid-state imaging device 11H which includes a light shielding film 32H formed in a striped shape (comb shape) for each column of pixels 12H. In addition, FIG. 12B illustrates an example of the planar configuration of a solid-state imaging device 11J which includes a light shielding film 32J formed in a lattice shape to form an opening corresponding to the PD 21 of the pixel 12H.

In this manner, in the solid-state imaging device 11H, in which the pixel sharing structure is not used, a negative bias is applied to the light shielding film 32H, and thus it is possible to reduce cross-talk between the pixels 12H. Similarly, in the solid-state imaging device 11J, a negative bias is applied to the light shielding film 32J, and thus it is possible to reduce cross-talk between the pixels 12J.

FIG. 13A illustrates an example of the planar configuration of a solid-state imaging device 11K which includes a light shielding film 32K formed in a stripe shape (comb shape) for every two columns of pixels 12K. For example, in FIG. 13A, pixels 12K-9 and 12K-10 surrounded by a two-dot chain line frame form a sharing structure. In addition, FIG. 13B illustrates an example of the planar configuration of a solid-state imaging device 11L which includes a light shielding film 32L formed in a stripe shape (comb shape) for every four columns of pixels 12L. For example, in FIG. 13B, pixels 12L-9 to 12L-12 surrounded by a two-dot chain line frame, form a sharing structure.

In this manner, in the solid-state imaging device 11K, in which the pixel sharing structure is used, the light shielding film 32K is formed in a stripe shape, and thus it is possible to reduce the area of the light shielding film 32K (for example, reduce approximately in half) and it is possible to further improve volumetric efficiency, compared to the configuration formed in the lattice shape. Similarly, even in the solid-state imaging device 11L, it is possible to improve volumetric efficiency.

Figure 14A:
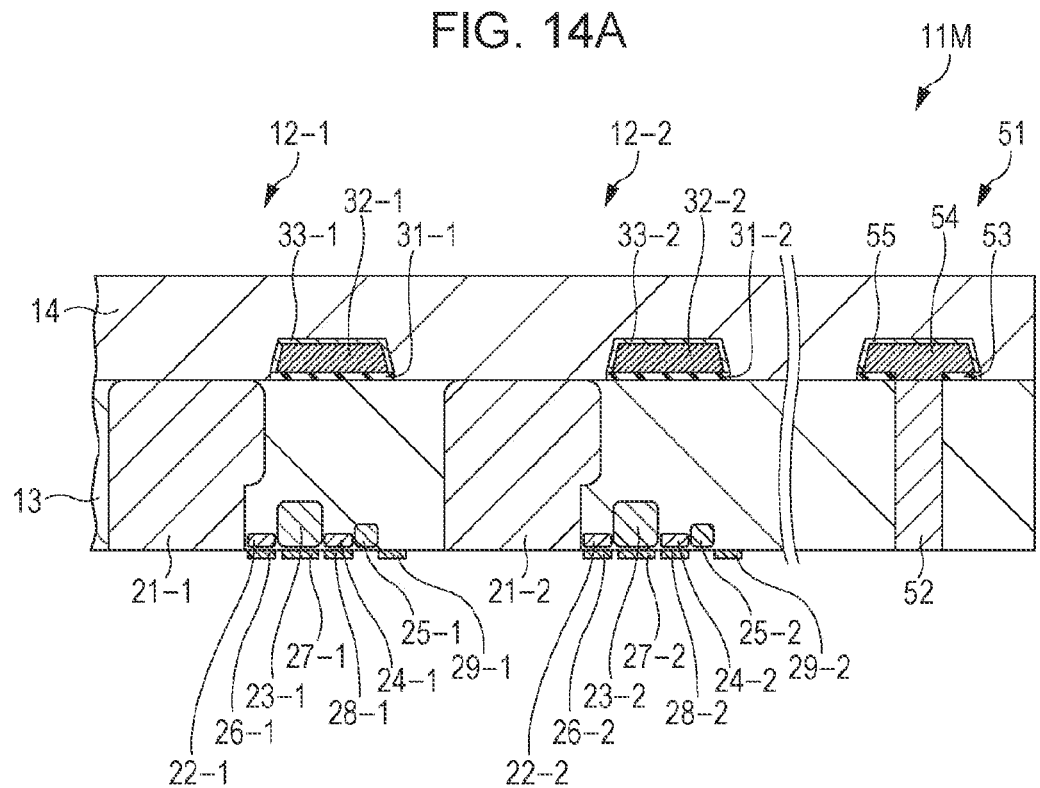
FIGS. 14A and 14B are diagrams illustrating an example of the configuration of a solid-state imaging device according to a ninth embodiment.
Figure 14B:
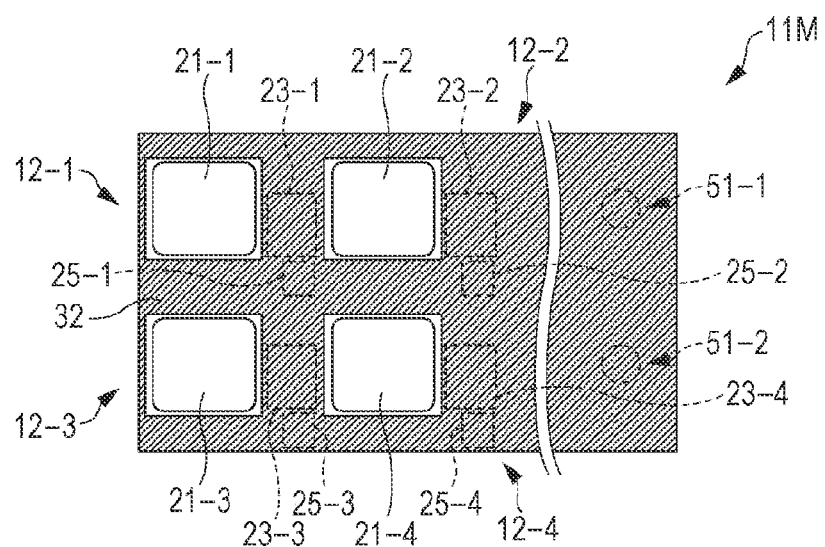

Subsequently, FIGS. 14A and 14B are diagrams illustrating an example of the configuration of a solid-state imaging device according to a ninth embodiment. Meanwhile, in a solid-state imaging device 11M shown in FIGS. 14A and 14B, the same reference numerals are used to indicate the same components of the solid-state imaging device 11 shown in FIGS. 1A and 1B, and the detailed description thereof will not be repeated.

FIG. 14A illustrates an example of the cross-sectional configuration including the peripheral section of the solid-state imaging device 11M, and FIG. 14B illustrates an example of the planar configuration including the peripheral section of the solid-state imaging device 11M.

As shown in FIGS. 14A and 14B, the solid-state imaging device 11M is configured to be the same as the solid-state imaging device 11 shown in FIGS. 1A and 1B in the configuration of a region where the pixel 12 is formed. That is, the solid-state imaging device 11M is configured to be the same as the solid-state imaging device 11 shown in FIGS. 1A and 1B in that a photoelectric conversion film 14 is laminated on a semiconductor substrate 13 and a PD 21, a channel region 22, a memory section 23, a channel region 24, an FD section 25, a gate electrode 26, an electrode 27, a gate electrode 28, a gate electrode 29, an insulating film 31, a light shielding film 32, and a low reflection film 33 are formed for each pixel 12.

Further, in the solid-state imaging device 11M, a light shielding film contact section 51 is formed in the peripheral section of the solid-state imaging device 11M. In the light shielding film contact section 51, a through wiring 52 is formed to penetrate the semiconductor substrate 13. Meanwhile, the through wiring 52 is formed before the photoelectric conversion film 14 is formed.

In addition, in the solid-state imaging device 11M, an insulating film 53 provided with an opening which is open in relevant to the through wiring 52 is laminated on the light irradiated surface of the semiconductor substrate 13, and a light shielding film 54 is laminated on the insulating film 53. That is, when the opening is provided for the through wiring 52, the light shielding film 54 is connected to the through wiring 52. Further, a low reflection film 55 is laminated on the light shielding film 54. In addition, as shown in FIG. 14B, the light shielding film 32 is formed in a mesh shape which is open in relevant to the PD 21, and the light shielding film 32 and the light shielding film 54 are integrally formed.

In this manner, in the solid-state imaging device 11M, the light shielding film contact section 51 is formed in the peripheral section, and thus it is possible to easily apply a bias to the light shielding film 32.

In addition, similar to the solid-state imaging device 11 shown in FIGS. 1A and 1B, the solid-state imaging device 11M is provided with the light shielding film 32 and is configured to use a material which has a high absorption coefficient for the photoelectric conversion film 14, and thus it is possible to make the photoelectric conversion film 14 be thin and decrease the solid-state imaging device 11M in height.

Meanwhile, the above-described solid-state imaging device 11 according to each embodiment can be applied to various electronic apparatuses including, for example, an imaging system, such as a digital still camera or a digital video camera, a mobile phone having an imaging function, and other equipment including an imaging function.

Figure 15:
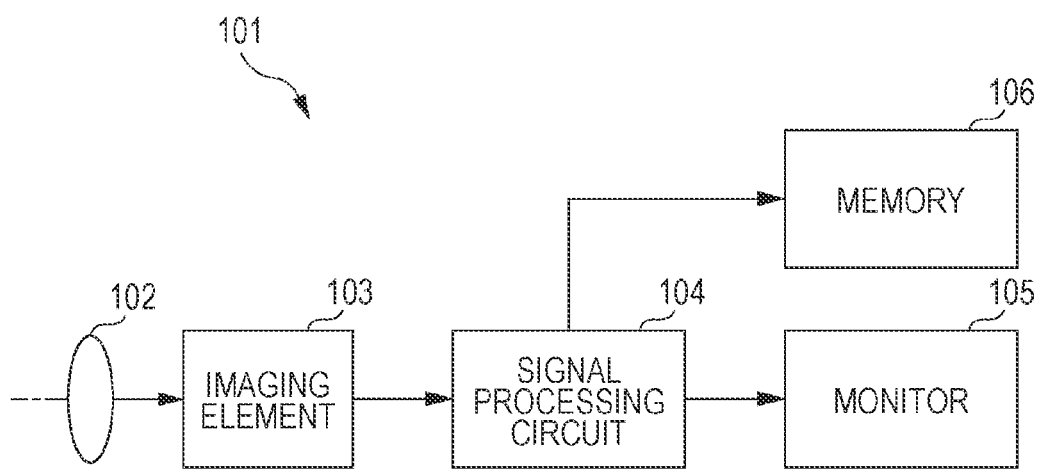
FIG. 15 is a block diagram illustrating an example of the configuration of an imaging device which is mounted on an electronic apparatus.

FIG. 15 is a block diagram illustrating an example of the configuration of an imaging device which is mounted in the electronic apparatus.

As shown in FIG. 15, the imaging device 101 includes an optical system 102, an imaging element 103, a signal processing circuit 104, a monitor 105, and a memory 106. The imaging device 101 is capable of imaging still images and moving images.

The optical system 102 includes one or a plurality of lenses, guides image light (incident light) from a subject to the imaging element 103, and forms an image on the light reception surface (sensor section) of the imaging element 103.

The above-described solid-state imaging device 11 according to each embodiment is applied as the imaging element 103. Electrons are accumulated in the imaging element 103 for a predetermined period according to the image formed on the light reception surface through the optical system 102. Further, a signal according to the electrons accumulated in the imaging element 103 is supplied to the signal processing circuit 104.

The signal processing circuit 104 performs various types of signal processing on pixel signals which are output from the imaging element 103. An image (image data), which is acquired in such a way that the signal processing circuit 104 performs the signal processing, is supplied to and displayed on the monitor 105, and supplied to and stored (recorded) in the memory 106.

When the above-described solid-state imaging device 11 according to each embodiment is applied to the imaging device 101 which is configured as described above, it is possible to acquire, for example, an image having high sensitivity and high quality.

Meanwhile, the present disclosure can include the following configurations.

(1) A solid-state imaging device including: a semiconductor substrate that is formed with a photodiode for each pixel; a light shielding film that is laminated on the semiconductor substrate on a side of a light irradiated surface which is irradiated with light, and is formed to include an opening corresponding to a spot in which at least the photodiode is arranged; and a photoelectric conversion film that is laminated to cover the light irradiated surface of the semiconductor substrate and the light shielding film, and is configured to generate an electrical charge by absorbing light. The photoelectric conversion film is formed of a material which has higher light absorptivity than light absorptivity of the semiconductor substrate.

(2) In the solid-state imaging device of (1), a surface of the photoelectric conversion film is planarized.

(3) In the solid-state imaging device of (1) or (2), a negative bias is applied to the light shielding film.

(4) In the solid-state imaging device of any one of (1) to (3), an arrangement location of the light shielding film is adjusted to move on a central side of the solid-state imaging device in the pixel which is arranged in the vicinity of an end section of the solid-state imaging device according to planar arrangement of the pixel.

(5) In the solid-state imaging device of any one of (1) to (4), the light shielding film is formed to cover at least a memory section that temporarily holds the electrical charge transmitted from the photodiode and an electrical charge detection section that converts the electrical charge transmitted from the photodiode into a voltage.

(6) In the solid-state imaging device of any one of (1) to (5), the light shielding film is formed to cover at least a memory section that temporarily holds the electrical charge transmitted from the photodiode.

(7) In the solid-state imaging device of any one of (1) to (6), high reflection film that has high reflectance of light is formed to cover the light shielding film.

(8) The solid-state imaging device of any one of (1) to (7) further includes a color filter layer that is laminated on the photoelectric conversion film and is configured to pass predetermined color light for each pixel, and a thickness of the light shielding film, and a thickness of a film that is formed to cover the light shielding film, and reflectance are differently formed for each pixel according to a color of the color filter layer.

(9) In the solid-state imaging device of any one of (1) to (8), the light irradiated surface is a back surface when it is assumed that a surface of the semiconductor substrate, on which a wiring layer is laminated, is a front surface.

(10) A method of manufacturing a solid-state imaging device, the method including: laminating a light shielding film, formed to include an opening corresponding to a spot in which at least a photodiode is arranged, on a light irradiated surface, which is irradiated with light, of a semiconductor substrate that is formed with the photodiode for each pixel; and laminating a photoelectric conversion film, configured to generate an electrical charge by absorbing light, to cover the light irradiated surface of the semiconductor substrate and the light shielding film. The photoelectric conversion film is formed of a material which has higher light absorptivity than light absorptivity of the semiconductor substrate.

(11) An electronic apparatus including a solid-state imaging device which includes: a semiconductor substrate that is formed with a photodiode for each pixel; a light shielding film that is laminated on the semiconductor substrate on a side of a light irradiated surface which is irradiated with light, and is formed to include an opening corresponding to a spot in which at least the photodiode is arranged; and a photoelectric conversion film that is laminated to cover the light irradiated surface of the semiconductor substrate and the light shielding film, and is configured to generate an electrical charge by absorbing light. The photoelectric conversion film is formed of a material which has higher light absorptivity than light absorptivity of the semiconductor substrate.

(12) In the electronic apparatus of (11), a surface of the photoelectric conversion film is planarized.

(13) In the electronic apparatus of (11) or (12), a negative bias is applied to the light shielding film.

(14) In the electronic apparatus of any one of (11) to (13), an arrangement location of the light shielding film is adjusted to move on a central side of the solid-state imaging device in the pixel which is arranged in the vicinity of an end section of the solid-state imaging device according to planar arrangement of the pixel.

(15) In the electronic apparatus of any one of (11) to (14), the light shielding film is formed to cover at least a memory section that temporarily holds the electrical charge transmitted from the photodiode and an electrical charge detection section that converts the electrical charge transmitted from the photodiode into a voltage.

(16) In the electronic apparatus of any one of (11) to (15), the light shielding film is formed to cover at least a memory section that temporarily holds the electrical charge transmitted from the photodiode.

(17) In the electronic apparatus of any one of (11) to (16), a high reflection film that has high reflectance of light is formed to cover the light shielding film.

(18) The electronic apparatus of any one of (11) to (17) further includes a color filter layer that is laminated on the photoelectric conversion film and is configured to pass predetermined color light for each pixel, and a thickness of the light shielding film, and a thickness of a film that is formed to cover the light shielding film, and reflectance are differently formed for each pixel according to a color of the color filter layer.

(19) In the electronic apparatus of any one of (11) to (18), the light irradiated surface is a back surface when it is assumed that a surface of the semiconductor substrate, on which a wiring layer is laminated, is a front surface.

Meanwhile, embodiments are not limited to the above-described embodiments and various modifications are possible without departing from the gist of the present disclosure.

What is claimed is:

1. A solid-state imaging device comprising:
a semiconductor substrate that is formed with a photodiode for each pixel;
a light shielding film that is laminated on the semiconductor substrate on a side of a light irradiated surface which is irradiated with light, and is formed to include an opening corresponding to a spot in which at least the photodiode is arranged; and
a photoelectric conversion film that is laminated to cover the light irradiated surface of the semiconductor substrate and the light shielding film, and is configured to generate an electrical charge by absorbing light,
wherein the photoelectric conversion film is formed of a material which has higher light absorptivity than light absorptivity of the semiconductor substrate, and
wherein the light-irradiated surface is a back surface when it is assumed that a surface of the semiconductor substrate, on which a wiring layer is laminated, is a front surface.

2. The solid-state imaging device according to claim 1, wherein a surface of the photoelectric conversion film is planarized.

3. The solid-state imaging device according to claim 1, wherein a negative bias is applied to the light shielding film.

4. The solid-state imaging device according to claim 1, wherein an arrangement location of the light shielding film is adjusted to move on a central side of the solid-state imaging device in the pixel which is arranged in the vicinity of an end section of the solid-state imaging device according to planar arrangement of the pixel.

5. The solid-state imaging device according to claim 1, wherein the light shielding film is formed to cover at least a memory section that temporarily holds the electrical charge transmitted from the photodiode and an electrical charge detection section that converts the electrical charge transmitted from the photodiode into a voltage.

6. The solid-state imaging device according to claim 1, wherein the light shielding film is formed to cover at least a memory section that temporarily holds the electrical charge transmitted from the photodiode.

7. The solid-state imaging device according to claim 1, wherein a high reflection film that has high reflectance of light is formed to cover the light shielding film.

8. The solid-state imaging device according to claim 1, further comprising:
a color filter layer that is laminated on the photoelectric conversion film and is configured to pass predetermined color light for each pixel,
wherein a thickness of the light shielding film, and a thickness of a film that is formed to cover the light shielding film, and reflectance are differently formed for each pixel according to a color of the color filter layer.

9. A method of manufacturing a solid-state imaging device, the method comprising:
laminating a light shielding film, formed to include an opening corresponding to a spot in which at least a photodiode is arranged, on a light irradiated surface, which is irradiated with light, of a semiconductor substrate that is formed with the photodiode for each pixel; and
laminating a photoelectric conversion film, configured to generate an electrical charge by absorbing light, to cover the light irradiated surface of the semiconductor substrate and the light shielding film,
wherein the photoelectric conversion film is formed of a material which has higher light absorptivity than light absorptivity of the semiconductor substrate, and
wherein the light-irradiated surface is a back surface when it is assumed that a surface of the semiconductor substrate, on which a wiring layer is laminated, is a front surface.

10. An electronic apparatus comprising a solid-state imaging device which includes:
a semiconductor substrate that is formed with a photodiode for each pixel;
a light shielding film that is laminated on the semiconductor substrate on a side of a light irradiated surface which is irradiated with light, and is formed to include an opening corresponding to a spot in which at least the photodiode is arranged; and
a photoelectric conversion film that is laminated to cover the light irradiated surface of the semiconductor substrate and the light shielding film, and is configured to generate an electrical charge by absorbing light, wherein the photoelectric conversion film is formed of a material which has higher light absorptivity than light absorptivity of the semiconductor substrate, and wherein the light-irradiated surface is a back surface when it is assumed that a surface of the semiconductor substrate, on which a wiring layer is laminated, is a front surface.

11. The electronic apparatus according to claim 10, wherein a surface of the photoelectric conversion film is planarized.

12. The electronic apparatus according to claim 10, wherein a negative bias is applied to the light shielding film.

13. The electronic apparatus according to claim 10, wherein an arrangement location of the light shielding film is adjusted to move on a central side of the solid-state imaging device in the pixel which is arranged in the vicinity of an end section of the solid-state imaging device according to planar arrangement of the pixel.

14. The electronic apparatus according to claim 10, wherein the light shielding film is formed to cover at least a memory section that temporarily holds the electrical charge transmitted from the photodiode and an electrical charge detection section that converts the electrical charge transmitted from the photodiode into a voltage.

15. The electronic apparatus according to claim 10, wherein the light shielding film is formed to cover at least a memory section that temporarily holds the electrical charge transmitted from the photodiode.

16. The electronic apparatus according to claim 10, wherein a high reflection film that has high reflectance of light is formed to cover the light shielding film.

17. The electronic apparatus according to claim 10, further comprising:

a color filter layer that is laminated on the photoelectric conversion film and is configured to pass predetermined color light for each pixel, wherein a thickness of the light shielding film, and a thickness of a film that is formed to cover the light shielding film, and reflectance are differently formed for each pixel according to a color of the color filter layer.

* * * * *